United States Patent
Miyajima et al.

(10) Patent No.: US 6,801,301 B2
(45) Date of Patent: Oct. 5, 2004

(54) EXPOSURE APPARATUS

(75) Inventors: Yoshikazu Miyajima, Tochigi (JP); Hideki Nogawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/265,108

(22) Filed: Oct. 7, 2002

(65) Prior Publication Data

US 2003/0071982 A1 Apr. 17, 2003

(30) Foreign Application Priority Data

Oct. 12, 2001 (JP) .................................... 2001-315669
Jan. 8, 2002 (JP) .................................... 2002-001600

(51) Int. Cl.⁷ .................. G03B 27/58; G03B 27/52; G03B 27/42
(52) U.S. Cl. ................ 355/72; 355/30; 355/53
(58) Field of Search .................. 355/53, 72–76; 378/34, 35; 310/10, 12

(56) References Cited

U.S. PATENT DOCUMENTS

| | | | |
|---|---|---|---|
| 5,559,584 A | * | 9/1996 | Miyaji et al. .................. 355/73 |
| 5,633,698 A | | 5/1997 | Imai .............................. 355/72 |
| 6,522,385 B2 | * | 2/2003 | Ahn et al. ..................... 355/30 |
| 6,642,996 B2 | * | 11/2003 | Nogawa ....................... 355/72 |

FOREIGN PATENT DOCUMENTS

JP   8-167549   6/1996

* cited by examiner

Primary Examiner—Henry Hung Nguyen
(74) Attorney, Agent, or Firm—Fitzpatrick, Cella, Harper & Scinto

(57) ABSTRACT

An exposure apparatus includes a movable stage, a chuck device which is arranged on the stage and holds a substrate, a first gas supply device for supplying a gas to a position of the substrate to be exposed, and a plurality of divided planar members which are arranged adjacent to a periphery of the substrate such that at least a part of the divided planar members covers a position measurement mirror of the movable stage, and are flush with or substantially flush with a surface of the substrate or a substrate holding surface of the chuck device.

14 Claims, 29 Drawing Sheets

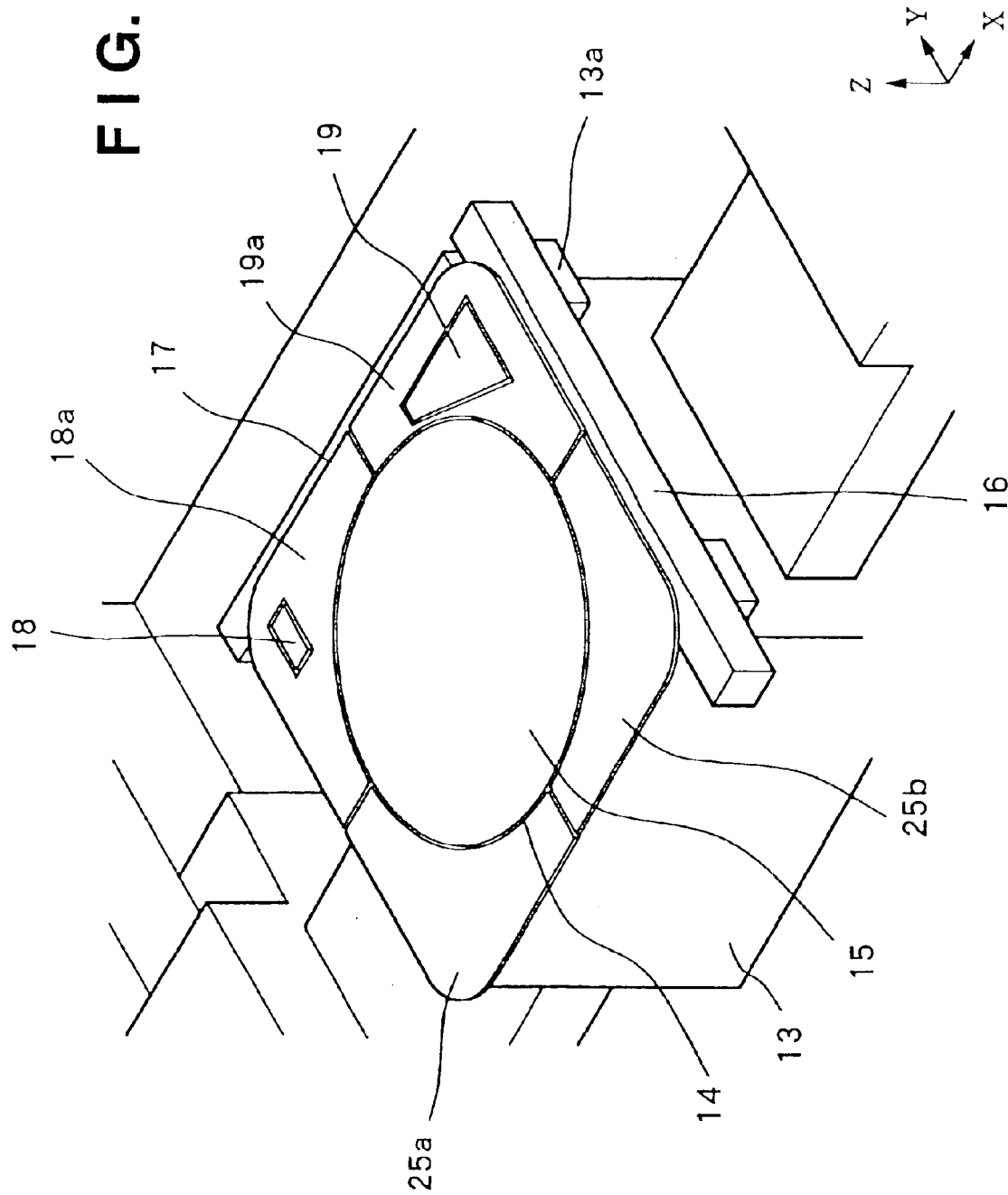

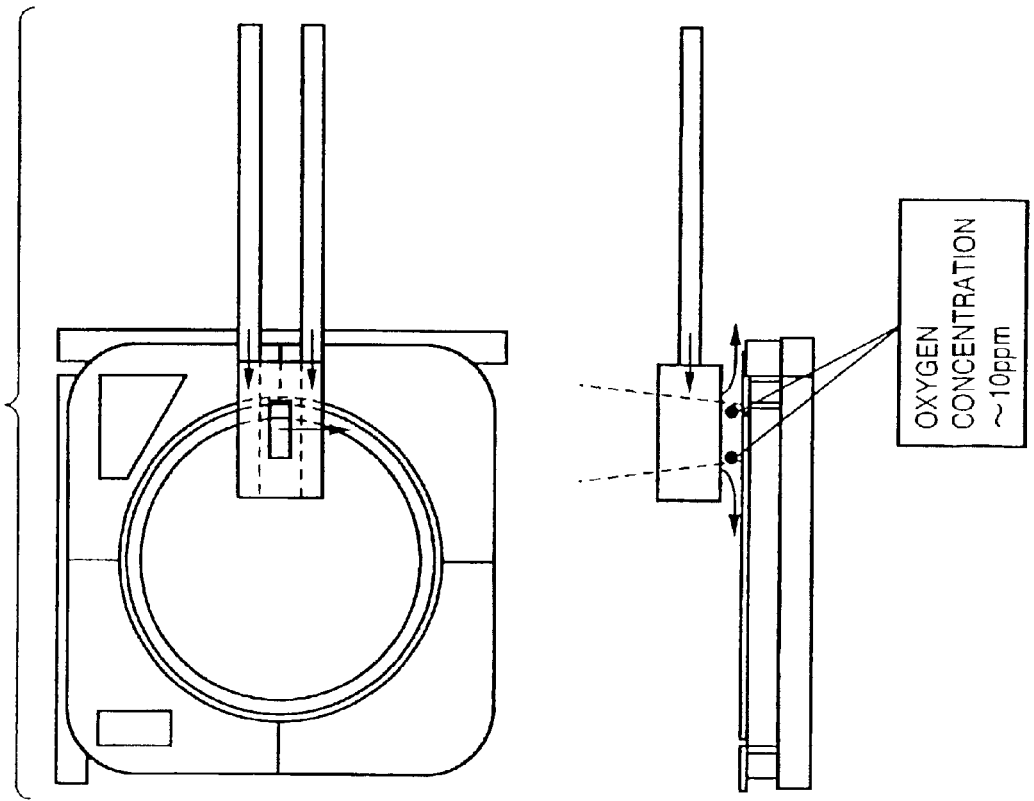
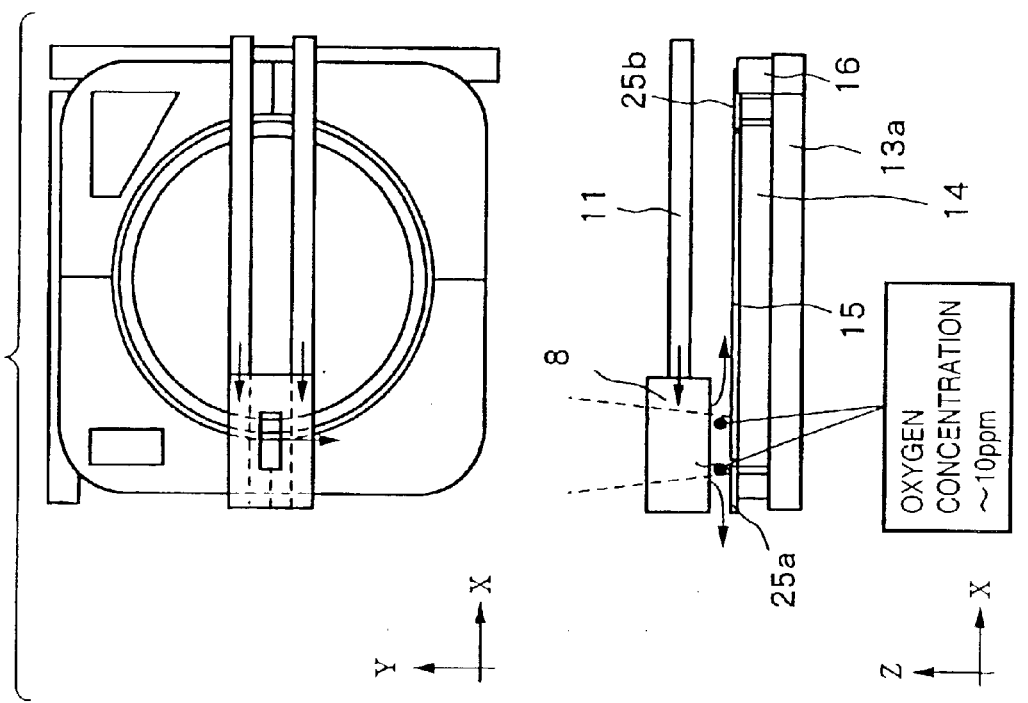

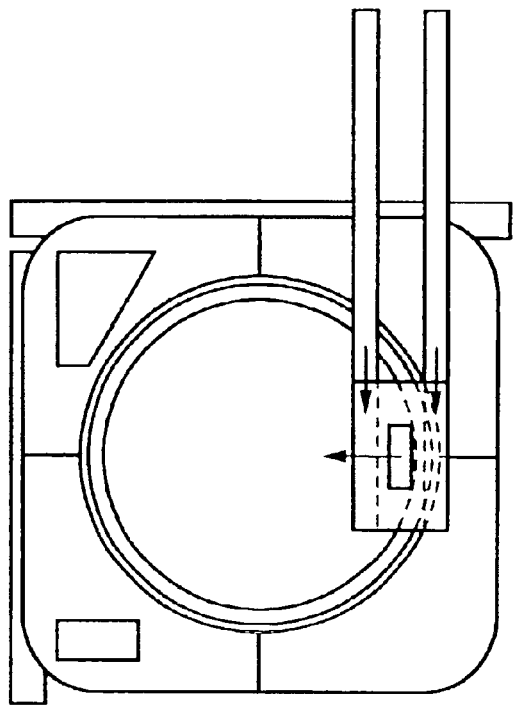
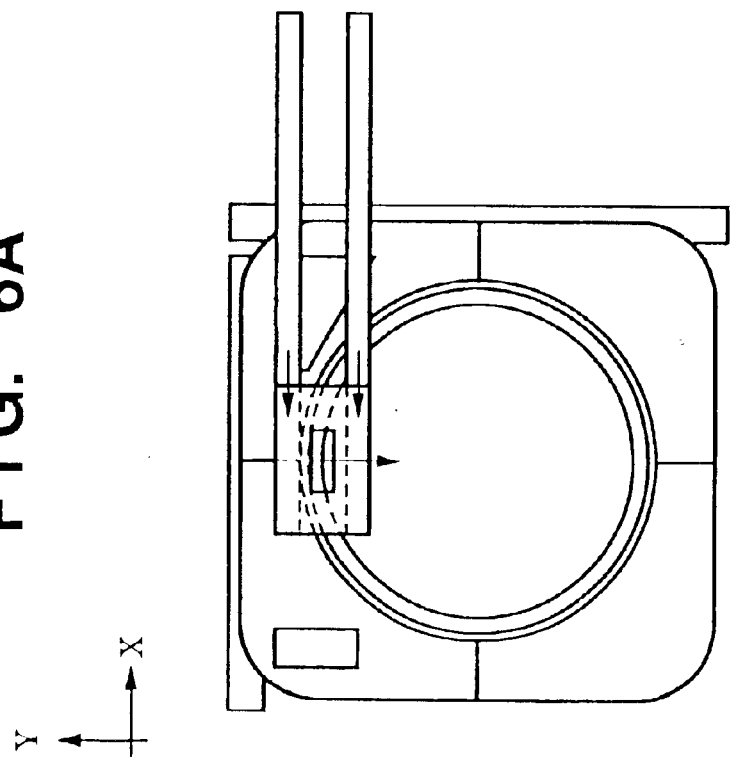

F I G. 11
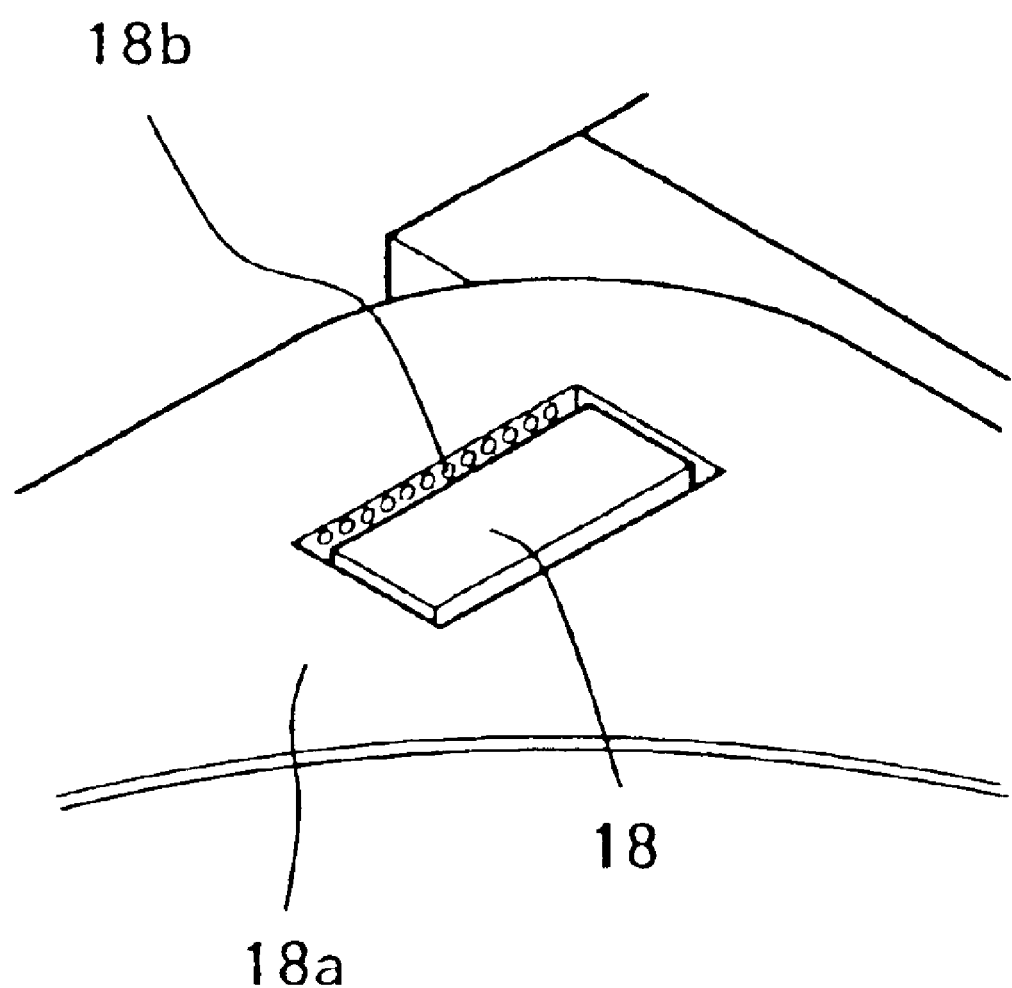

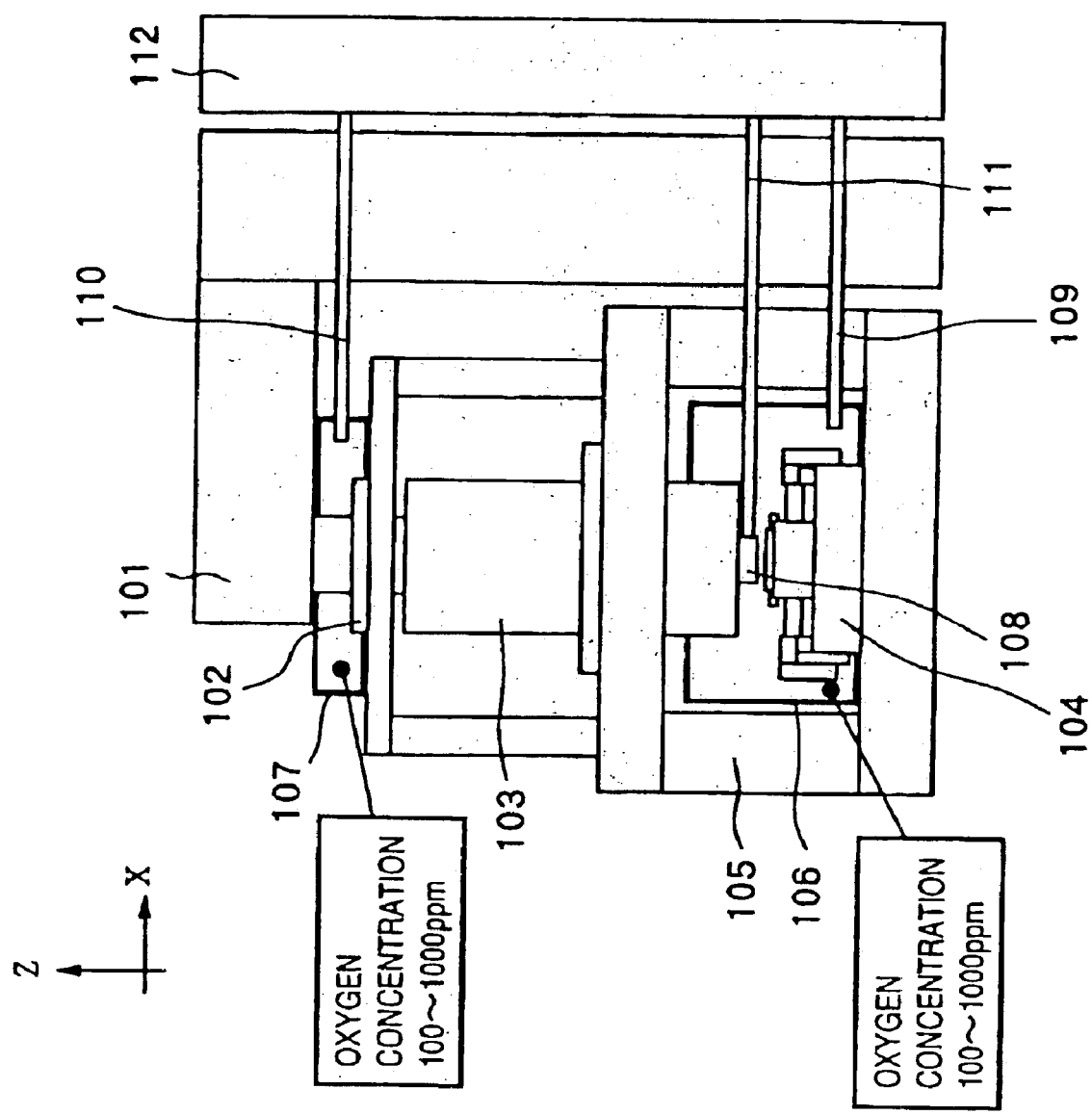

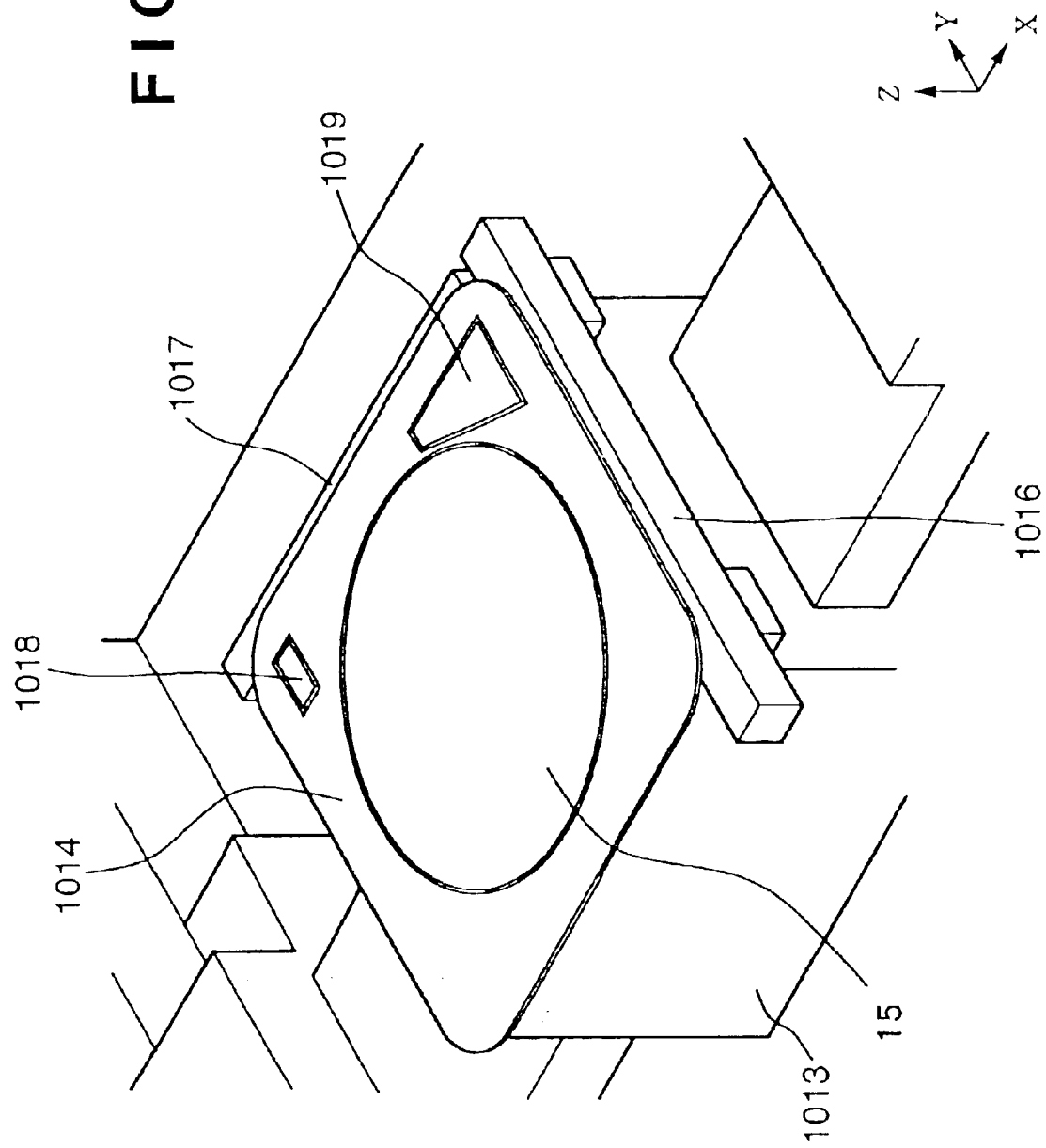

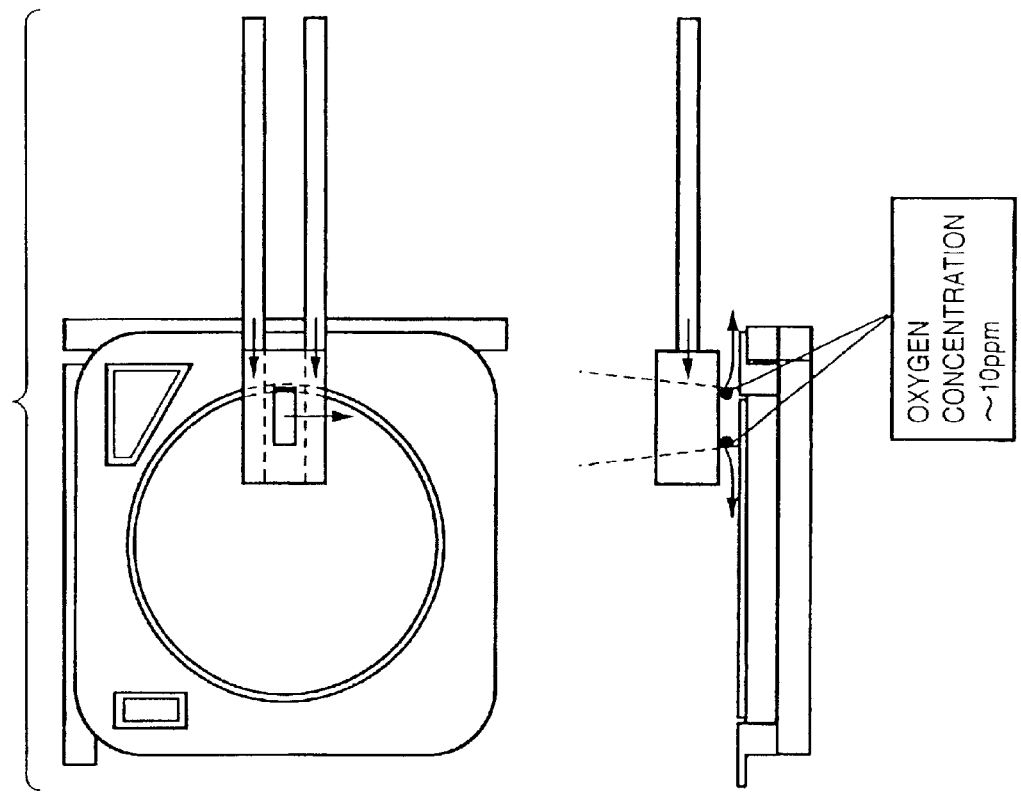
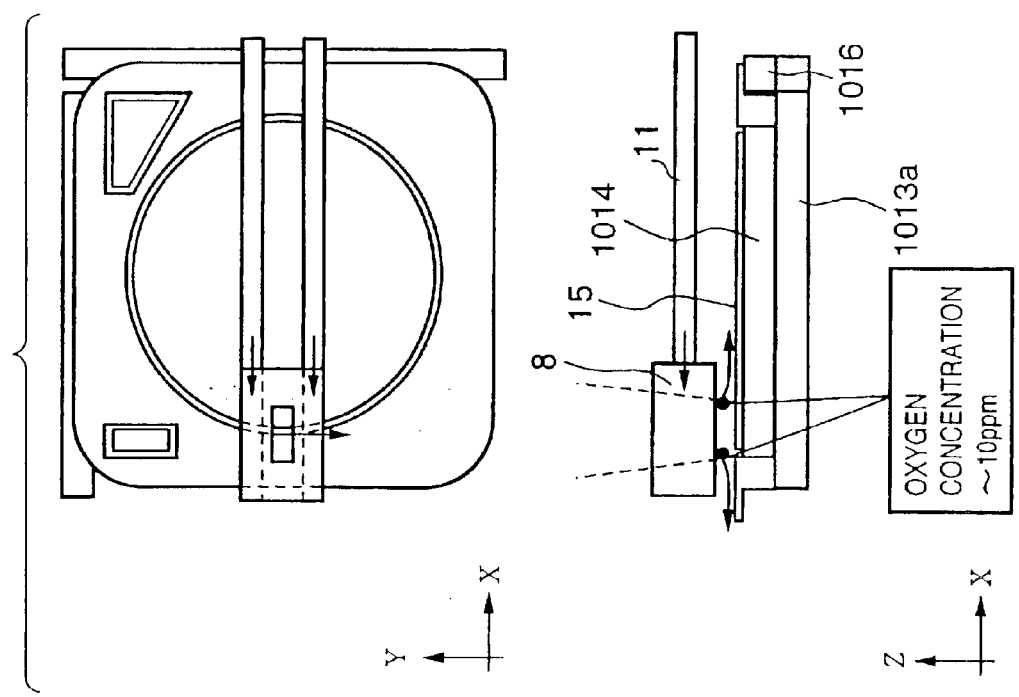

EXPOSURE APPARATUS

FIELD OF THE INVENTION

The present invention relates to an exposure apparatus used in a semiconductor manufacturing process, particularly, to a projection exposure apparatus which projects and transfers a reticle pattern onto a silicon wafer and, more particularly, to an exposure apparatus using a reticle stage and a wafer stage, which sequentially move a reticle and a silicon wafer with respect to a projection exposure system when projecting a reticle pattern onto the wafer.

BACKGROUND OF THE INVENTION

A conventional semiconductor manufacturing process uses a projection exposure apparatus which projects and transfers a reticle pattern onto a silicon wafer.

A conventional projection exposure apparatus is shown in FIGS. 16 to 20.

In FIGS. 16 to 20, reference numeral 101 denotes an illumination system unit having an exposure light source and a function of shaping exposure light and irradiating a reticle with the shaped light; 102, a reticle stage which supports a reticle serving as an exposure pattern master and performs a reticle scan operation with respect to a wafer at a predetermined reduction exposure magnification ratio; 103, a reduction projection lens which reduces a master pattern and projects it onto a wafer (substrate); 104, a wafer stage which sequentially, continuously moves a substrate (wafer) for every exposure; and 105, an exposure apparatus main body which supports the reticle stage 102, reduction projection lens 103, and wafer stage 104.

Reference numerals 106 and 107 denote a wafer stage purge partition and a reticle stage space purge partition for purging the wafer and reticle stage spaces with helium or nitrogen. The purposes of these partitions are to prevent, in general air, ozone generated by absorbing, in oxygen in air, $F_2$ laser ($\lambda$=157 nm), which is vacuum ultraviolet radiation (VUV) serving as exposure light, to prevent silicon oxide generated by absorption in silicon in air, and to prevent a decrease in the transmittance of exposure light caused by ammonia or silanol, which is generated by hydrolysis of organic gas such as siloxane or silazane and moisture in the air, and attaches to lens glass.

In other words, the wafer stage space is closed for efficient purge with helium or nitrogen supplied to increase the transmittance of exposure light. The oxygen and moisture concentrations in the space are decreased to 100 to 1,000 ppm.

Reference numeral 108 denotes a wafer purge nozzle, which is arranged to locally purge an exposure portion on the upper surface of a wafer with high-purity nitrogen gas and decreases oxygen and moisture concentrations to 10 ppm or less, which is lower than the oxygen concentrations (100 to 1,000 ppm) within the wafer stage purge partition 106 and reticle stage purge partition 107.

A wafer stage purge pipe 109, reticle stage purge pipe 110, and wafer purge pipe 111 are used to supply purge gas (helium, nitrogen, or the like) from a purge gas supply unit 112, to interiors of the partitions and the purge nozzle.

In FIG. 17, reference numeral 115 denotes a wafer whose single-crystal silicon substrate surface is coated with a resist in order to project and to transfer a reticle pattern drawn on a reticle substrate via a reduction exposure system; 113, a fine moving stage, which finely adjusts the wafer 115 in the optical axis direction and tilt direction of the reduction exposure system and a rotational direction of the reduction exposure system and a rotational direction about the optical axis as a center; 114, a wafer chuck, which supports and fixes the wafer 115 onto the fine moving stage 113; 116, an X bar mirror, which is a target for measuring the X position of the fine moving stage 113 by a laser interferometer; 117, a Y bar mirror, which is a target for measuring the Y position of the fine moving stage 113, and 118, an illuminance sensor, which is arranged on the upper surface of the fine moving stage 113, calibrates and measures the illuminance of exposure light before exposure, and uses the illuminance for correction of the exposure amount.

Reference numeral 119 denotes a stage reference mark, which is arranged on the upper surface of the fine moving stage 113 and has a stage alignment measurement target; 120, an X linear motor, which moves and drives the fine moving stage 113 in the X direction; 121, an X guide, which moves and guides the fine moving stage 113 in the X direction; 122, a Y guide, which moves and guides the X guide 121 and fine moving stage 113 in the Y direction; 123 and 124, Y linear motors, which move and drive the fine moving stage 113 in the Y direction; and 125, a stage surface plate, which plane-guides the fine moving stage 113.

As shown in FIGS. 18A and 18B, slit exposure light 126 is emitted to the center of the optical path of the exposure light. The wafer purge nozzle 108 is set above the exposed portion, and the space above the wafer 115 is purged with purge gas (nitrogen or the like) injected from the wafer purge nozzle 108. An oxygen concentration of 10 ppm is achieved around the center of the wafer 115. As shown in FIGS. 19A, 19B, 20A, and 20B, a gap of up to about 1 mm is formed between the wafer purge nozzle 108 and the wafer 115 in the direction of height, and a gap of up to about 2 mm is formed between the wafer purge nozzle 108 and the wafer chuck 114 when a shot near the periphery of the wafer 115 is to be exposed with the slit exposure light 126. The conventional wafer chuck 114 does not have a peripheral member which shields the wafer chuck 114 from a purge gas flow from the wafer purge nozzle 108. In exposing the wafer periphery, purge gas from the wafer purge nozzle 108 leaks in a large amount from the periphery of the wafer chuck 114 to decrease the pressure of the purge space. Gas other than purge gas externally flows into the purge space to increase the oxygen concentration to about 100 to 1,000 ppm. A low oxygen concentration equal to or less than a specified value (10 ppm or less) cannot be maintained.

SUMMARY OF THE INVENTION

The present invention has been made to overcome the conventional drawbacks, and has as its object to prevent a decrease in purge pressure in exposure and an increase in oxygen concentration caused by a purge error near the periphery of a wafer or a reticle.

To overcome the conventional drawbacks and to achieve the same object, an exposure apparatus according to the first aspect of the present invention has the following arrangement.

That is, the exposure apparatus comprises a movable stage, a chuck device, which is arranged on the stage and holds a substrate, a gas supply device for supplying gas to a position of the substrate to be exposed, and a planar member, which is arranged adjacent to a periphery of the substrate, is flush with or substantially flush with a surface of the substrate, and is integrated with the chuck device.

A device manufacturing method according to the present invention has the following steps.

That is, the device manufacturing method comprises the steps of applying a photosensitive material to a substrate, transferring a pattern to the photosensitive material applied to the substrate by the above-described exposure apparatus, and developing the substrate bearing the pattern.

Other objects and advantages besides those discussed above shall be apparent to those skilled in the art from the description of a preferred embodiment of the invention which follows. In the description, reference is made to the accompanying drawings, which form a part hereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 3 is an enlarged, perspective view showing a fine moving stage and a purge plate;

FIGS. 5A and 5B show plan views and side vies of a purge device;

FIGS. 6A and 6B are plan views showing the purge plate;

FIG. 11 is an enlarged, perspective view showing the fine moving stage and purge plate according to the third embodiment;

FIG. 16 is a view showing the whole arrangement of a conventional exposure apparatus;

FIG. 24 is an enlarged, perspective view showing a fine moving stage and a purge plate;

FIGS. 26A and 26B show plan views and side views of a purge device;

DETAILED DESCRIPTION OF THE PREFERRED EMBODIMENTS

Figure 1:
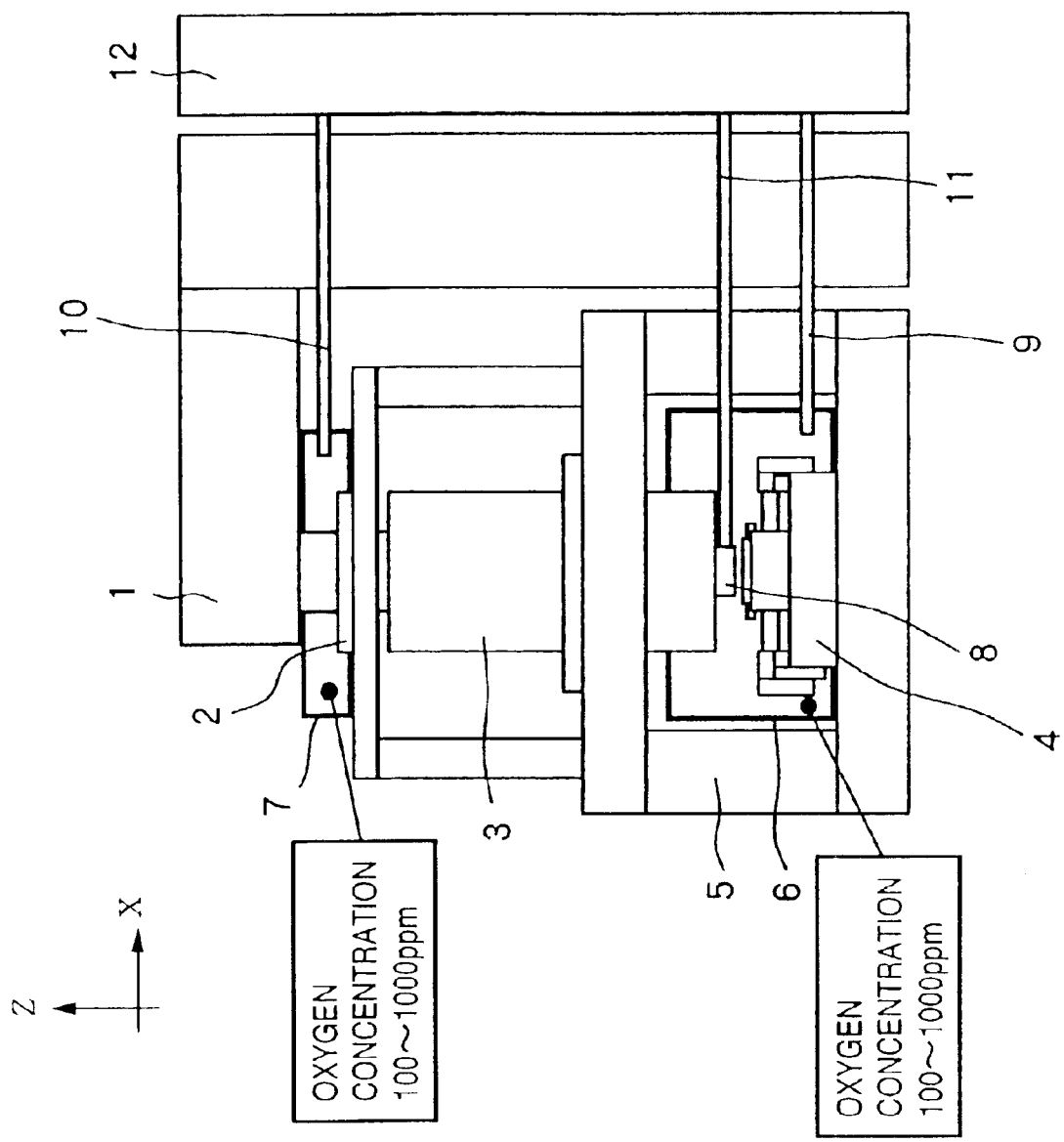
FIG. 1 is a view showing the whole arrangement of an exposure apparatus according to the first embodiment of the present invention.

Preferred embodiments of the present invention will be described in detail below with reference to the accompanying drawings.

(First Embodiment)

FIGS. 1 to 6B are views showing the arrangement of an exposure apparatus according to the first embodiment of the present invention.

The following description will use a "substrate", which means a wafer or a reticle.

In FIGS. 1 to 6B, reference numeral 1 denotes an illumination system unit having an exposure light source and a function of shaping exposure light and irradiating a reticle (substrate) with the shaped light; 2, a reticle stage, which supports a reticle serving as an exposure pattern master and performs a reticle scan operation with respect to a wafer; 3, a reduction projection lens, which reduces a master pattern and projects it onto a wafer (substrate); 4, a wafer stage, which sequentially, continuously moves a substrate (wafer) for every exposure; and 5, an exposure apparatus main body, which supports the reticle stage 2, projection lens 3, and wafer stage 4.

Reference numerals 6 and 7 denote a wafer stage purge partition and a reticle stage space purge partition for purging spaces around the wafer stage 4 and reticle stage 2 with helium or nitrogen.

The purposes of these partitions are to prevent, in general air, ozone generated by absorbing, in oxygen in air, $F_2$ laser ($\lambda$=157 nm), which is vacuum ultraviolet radiation (VUV) serving as exposure light, to prevent silicon oxide generated by absorption in a silicon-based impurity in air, and to prevent a decrease in the transmittance of exposure light caused by ammonia or silanol, which is generated by hydrolysis of moisture in air and organic gas such as siloxane or silazane volatilized from various acids, solvents, and the like, and attaches to lens glass.

In other words, the wafer stage purge partition 6 and a reticle stage space purge partition 7 are arranged to close the wafer stage space for efficient purge with helium or nitrogen serving as purge gas supplied to increase the transmittance of exposure light. The oxygen and moisture concentrations in the space are decreased to 100 to 1,000 ppm.

Reference numeral 8 denotes a wafer purge nozzle, which is arranged to locally purge an exposure portion on the upper surface of a wafer with high-purity nitrogen gas and decreases oxygen and moisture concentrations to 10 ppm or less, which is lower than the oxygen concentrations (100 to 1,000 ppm) within the wafer stage purge partition 6 and reticle stage purge partition 7.

A wafer stage purge pipe 9, a reticle stage purge pipe 10, and a wafer purge pipe 11 are used to supply purge gas (e.g., helium, nitrogen, or the like) from a purge gas supply unit 12 to the interiors of the partitions and the purge nozzle.

Figure 2:
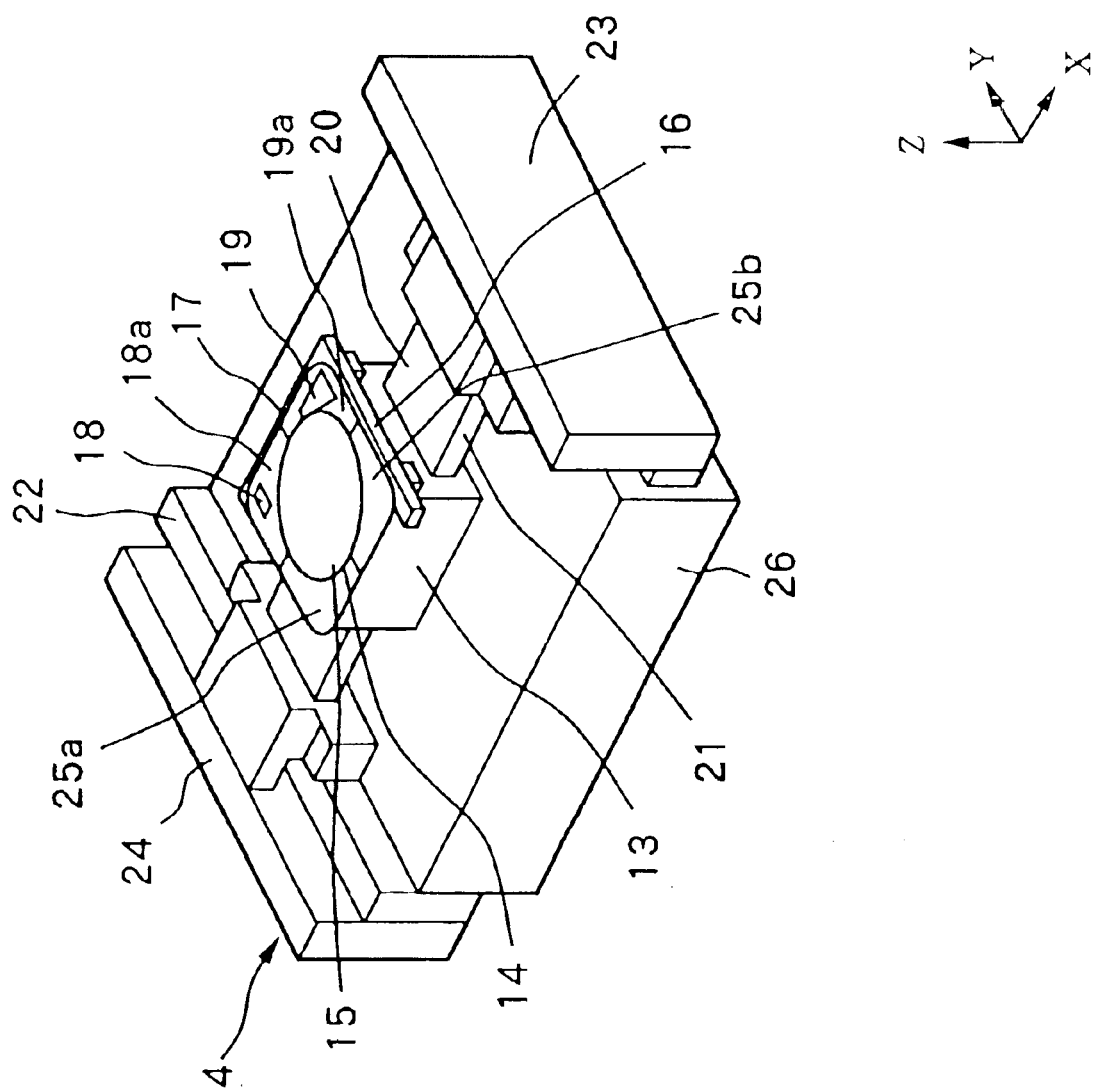
FIG. 2 is a perspective view showing a stage device in FIG. 1.

In FIG. 2, reference numeral 15 denotes a wafer whose single-crystal silicon substrate surface is coated with a resist in order to project and to transfer a reticle pattern drawn on a reticle substrate via a reduction exposure system; 13, a fine moving stage, which finely adjusts the wafer 15 in the optical axis direction and tilt direction of the reduction exposure system and a rotational direction about the optical axis as a center; 14, a wafer chuck, which supports and fixes the wafer 15 onto the fine moving stage 13; 16, an X bar mirror, which is a target mirror for measuring the X position of the fine moving stage by a laser interferometer (not shown); and 17, a Y bar mirror, which is a target for measuring the Y position of the fine moving stage.

Reference numeral 18 denotes an illumination sensor, which is arranged on the upper surface of the fine moving stage 13, calibrates and measures the illuminance of exposure light before exposure, and uses the illuminance for correction of the exposure amount.

Reference numeral 19 denotes a stage reference mark, which is arranged on the upper surface of the fine moving stage 13 and has a stage alignment measurement target. Alignment of the master and wafer stage, and the like, are performed by an alignment measurement device (not shown).

Reference numeral 20 denotes an X linear motor, which moves and drives the fine moving stage 13 in the X direction; 21, an X guide, which moves and guides the fine moving stage 13 in the X direction; 22, a Y guide, which moves and guides the X guide 21 and fine moving stage 13 in the Y direction; 23 and 24, Y linear motors, which move and drive the fine moving stage 13 in the Y direction; and 26, a stage surface plate, which plane-guides the fine moving stage 13.

As shown in FIG. 3, purge plates 25a and 25b are arranged adjacent to each other around the wafer chuck 14. The purge plates 25a and 25b are almost flush with the surface of the wafer 15, and form a purge space around the wafer chuck 14.

Similarly, an illuminance sensor purge plate 18a is arranged around the illuminance sensor 18, is almost flush with the surface of the wafer 15, and forms a purge space around the wafer chuck 14.

Similarly, a stage reference mark purge plate 19a is arranged around the stage reference mark 19, is almost flush with the surface of the wafer 15, and forms a purge space around the wafer chuck 14.

Figure 4A:
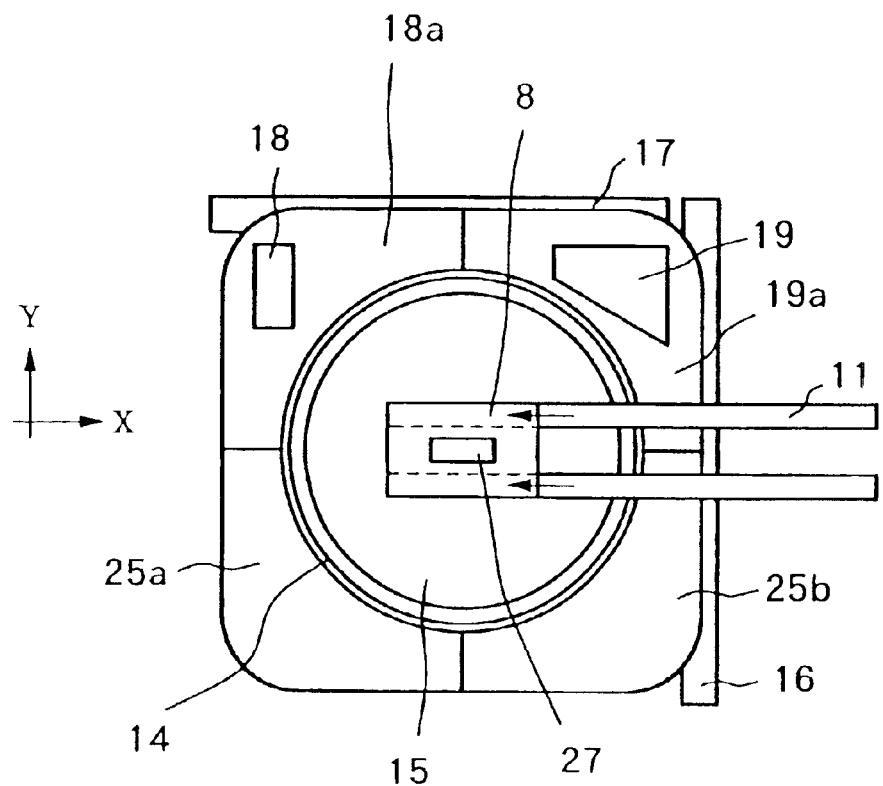
FIGS. 4A and 4B are a plan view and a side view showing the purge plate.
Figure 4B:
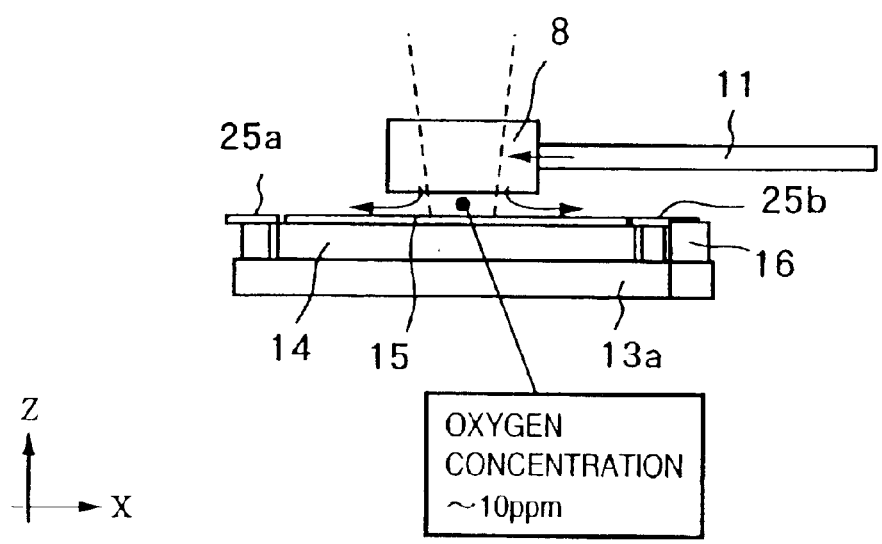

As shown in FIGS. 4A and 4B, slit exposure light 27 of a scan exposure type is emitted to the center of the optical path of exposure light. The wafer purge nozzle 8 is set above the exposed portion, and the space above the wafer 15 is purged with purge gas (nitrogen or the like) injected from the wafer purge nozzle 8. An oxygen concentration of 10 ppm or less is achieved around the center of the wafer 15.

The wafer 15 is surrounded by the purge plates 25a and 25b, illuminance sensor purge plate 18a, and stage reference mark purge plate 19a. Even in exposure at the periphery of the wafer 15, a decrease in the pressure of the purge space by the purge gas leaking from the periphery of the wafer chuck 14 can be prevented, as shown in FIGS. 5A, 5B, 6A, and 6B. Gas other than purge gas does not externally enter, and purge with nitrogen serving as purge gas from the wafer purge nozzle 8 is stably performed.

Hence, the oxygen concentration can be maintained at 10 ppm or less in the entire region irradiated with the slit exposure light 27.

(Second Embodiment)

Figure 7:
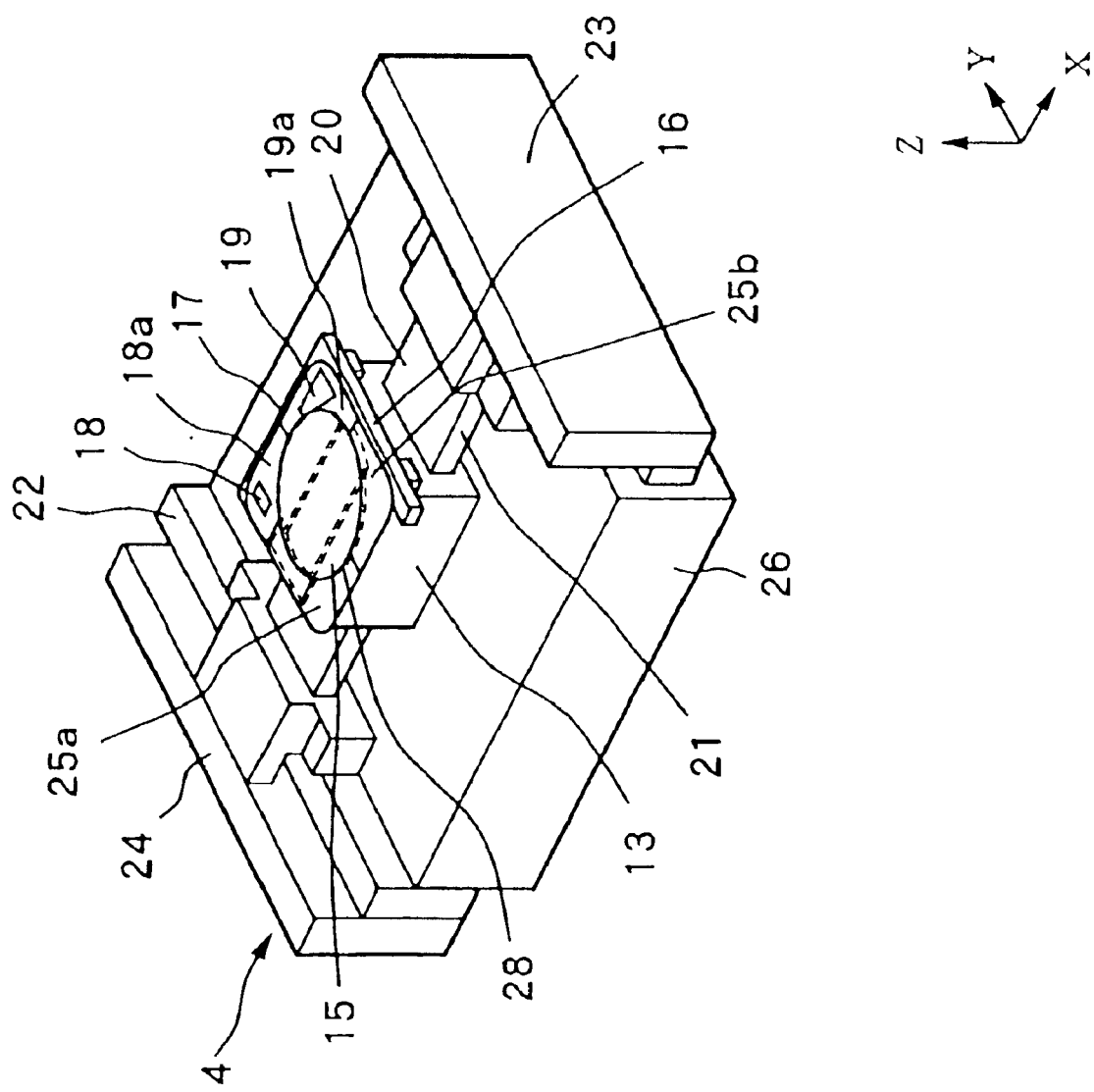
FIG. 7 is a perspective view showing a stage device according to the second embodiment of the present invention.
Figure 8:
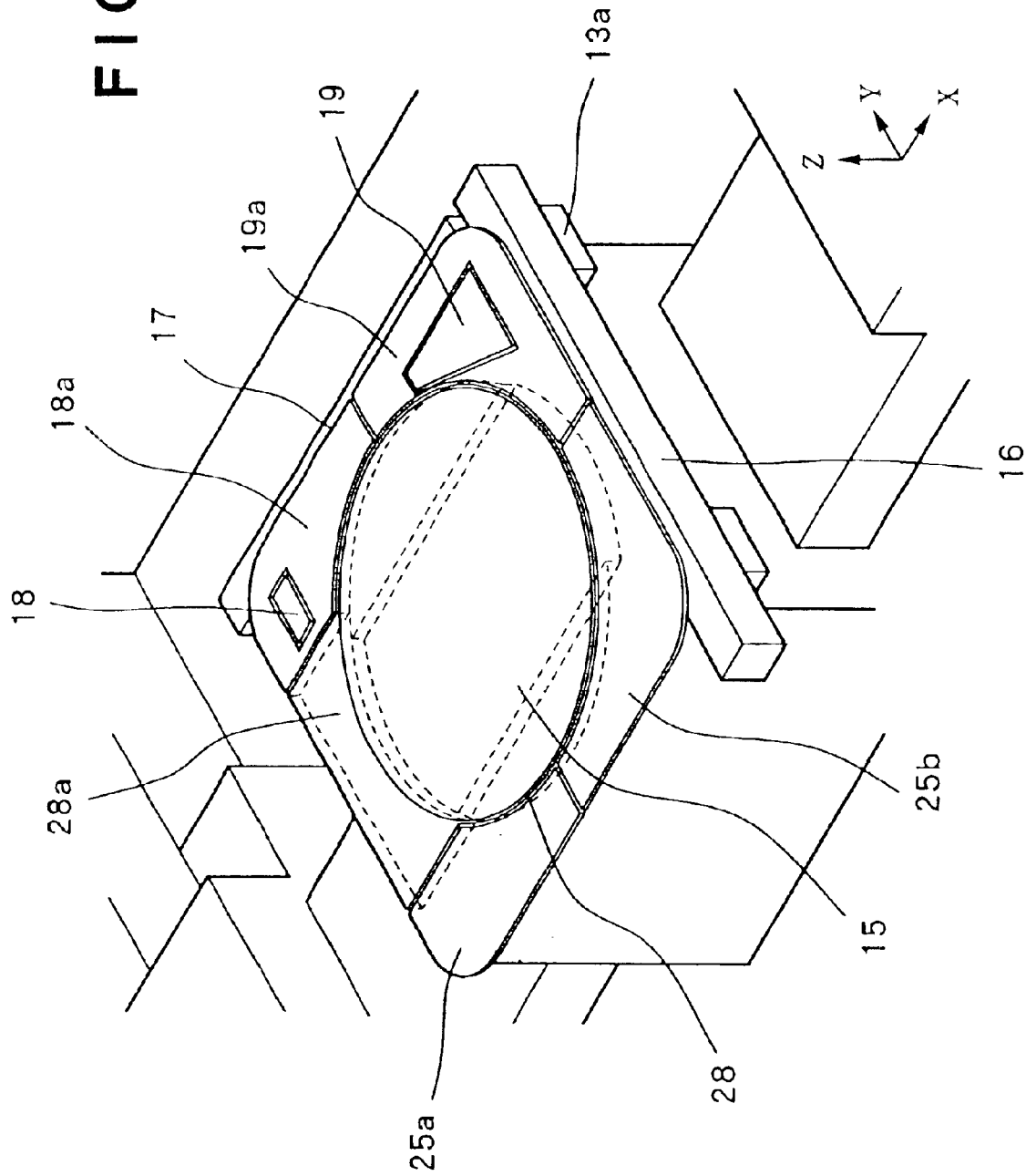
FIG. 8 is an enlarged, perspective view showing a fine moving stage and a purge plate according to the second embodiment.
Figure 9:
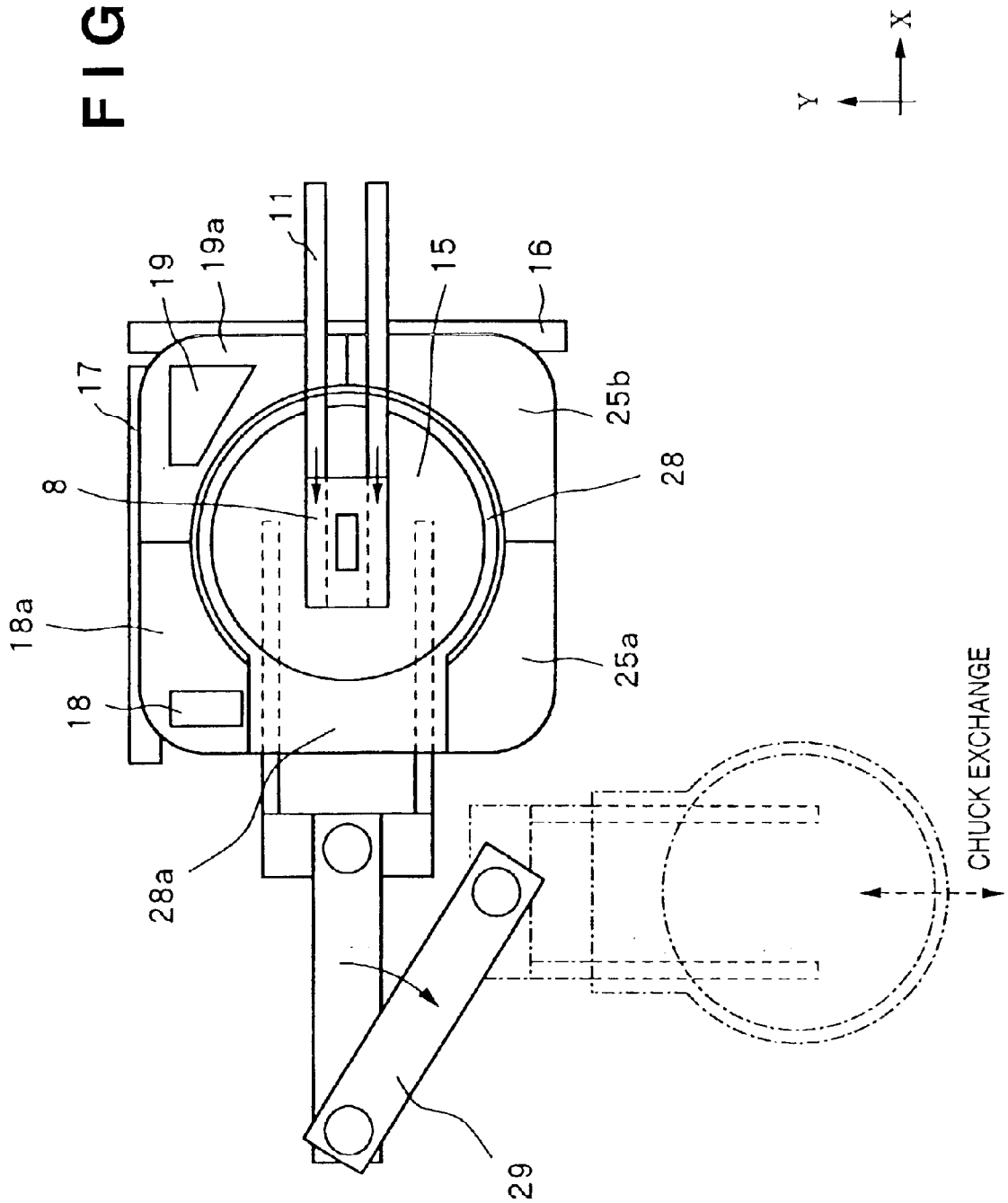
FIG. 9 is a plan view for explaining a chuck exchange method according to the second embodiment.

FIGS. 7 to 9 are views showing the second embodiment of the present invention.

The second embodiment adopts, instead of the wafer chuck 14 in the first embodiment, a purge plate-integrated wafer chuck and a purge plate-integrated portion 28a serving as one of purge plates. The purge plate-integrated wafer chuck 28 can be detached together with the purge plate in exchanging or cleaning the wafer chuck.

The purge plate-integrated wafer chuck 28 is detached by a chuck exchange unit 29 shown in FIG. 9. As shown in FIG. 9, the purge plate-integrated wafer chuck 28 is detached and exchanged by a robot having two forks. That is, the purge plate into which the two forks come can be retracted above and detached together with the wafer chuck. This structure enables automatically exchanging the wafer chuck without removing the purge plate around the wafer chuck.

(Third Embodiment)

Figure 10:
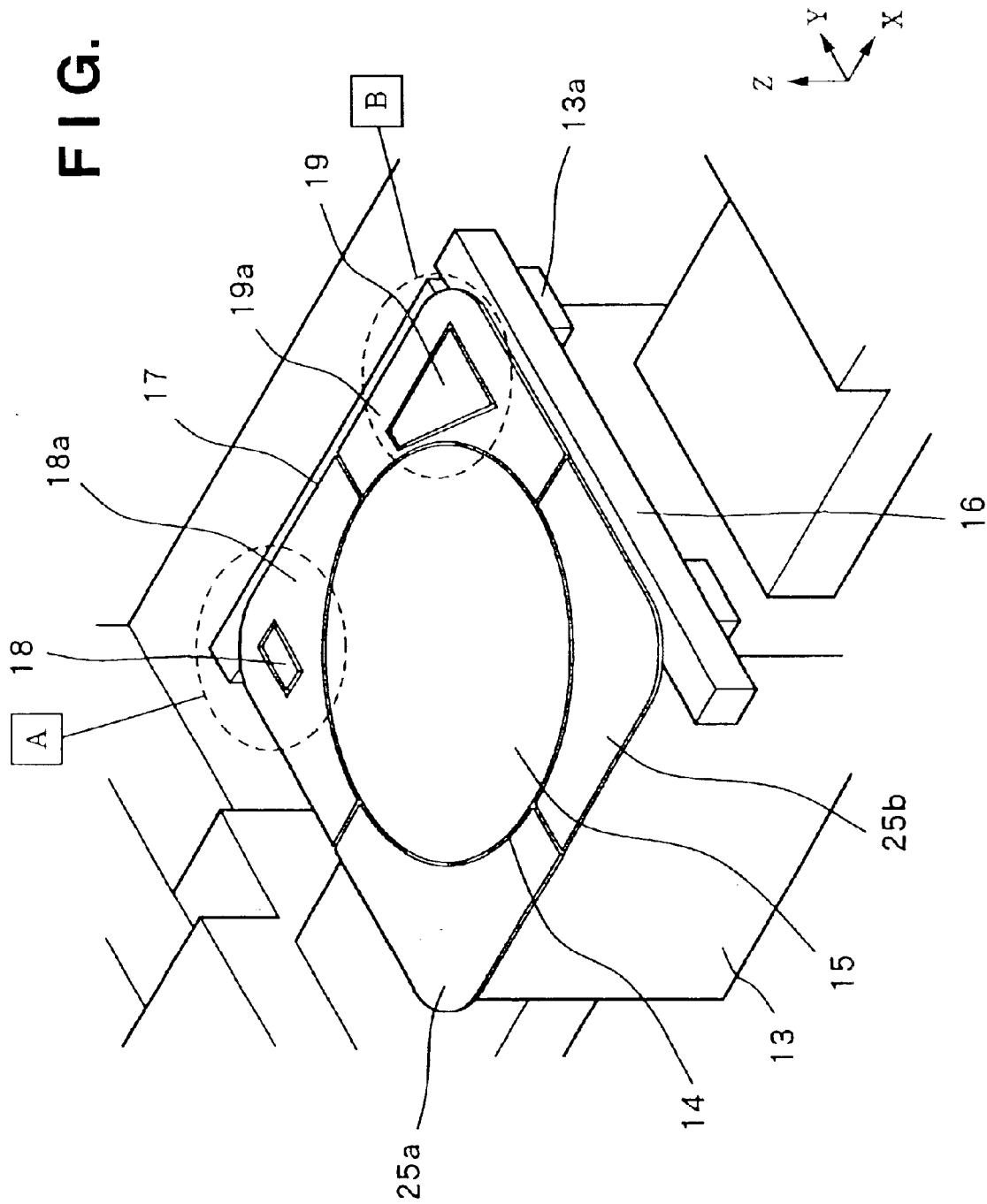
FIG. 10 is an enlarged, perspective view showing a fine moving stage and a purge plate according to the third embodiment.
Figure 12:
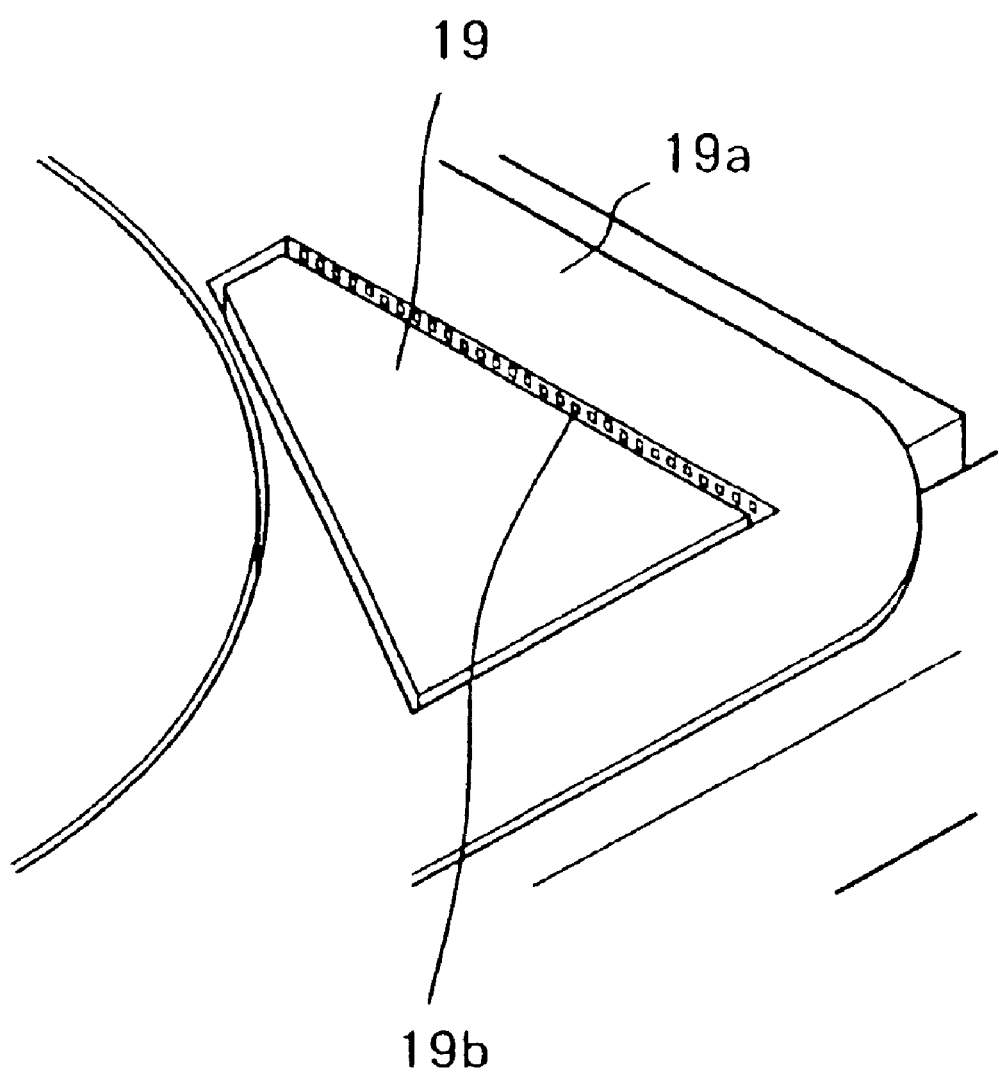
FIG. 12 is an enlarged, perspective view showing the fine moving stage and purge plate according to the third embodiment.
Figure 13:
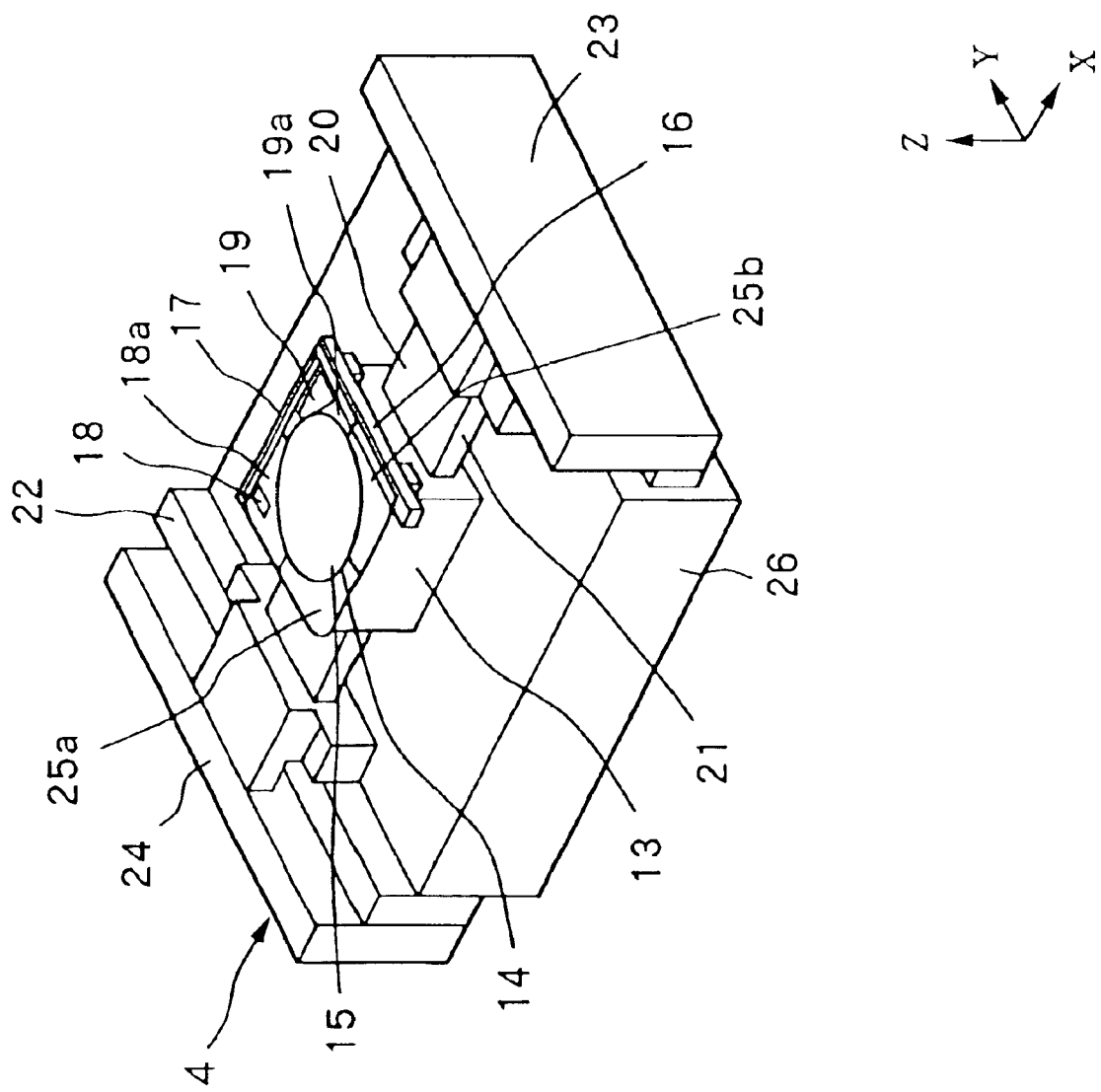
FIG. 13 is a perspective view showing a fine moving stage and purge plate according to the fourth embodiment.

FIGS. 10 to 12 are views showing the third embodiment of the present invention.

In the third embodiment, in addition to a wafer purge nozzle 8, local purge nozzles are newly arranged on a fine moving stage 13 near the illuminance sensor 18 and stage reference mark 19 as in the first embodiment. These nozzles realize more perfect purge near the illuminance sensor 18 and stage reference mark 19.

As shown in FIG. 11, an illuminance sensor purge nozzle 18b is formed in an illuminance sensor purge plate 18a for the illuminance sensor 18. The illuminance sensor purge nozzle 18b injects purge gas into a gap between the illuminance sensor 18 and the illuminance sensor purge plate 18a, thereby completely purging, with purge gas, air stagnated at the gap around the illuminance sensor 18.

As shown in FIG. 12, a stage reference mark purge nozzle 19b is formed in a stage reference mark purge plate 19a for the stage reference mark 19. The stage reference mark purge nozzle 19b injects purge gas into a gap between the stage reference mark 19 and the stage reference mark purge plate 19a, thereby completely purging, with purge gas, air stagnated at the gap.

(Fourth Embodiment)

FIGS. 13 to 15B are views showing the fourth embodiment of the present invention.

In the fourth embodiment, some of the purge plates in the first embodiment are integrated with an X bar mirror 16 and a Y bar mirror 17.

Figure 14:
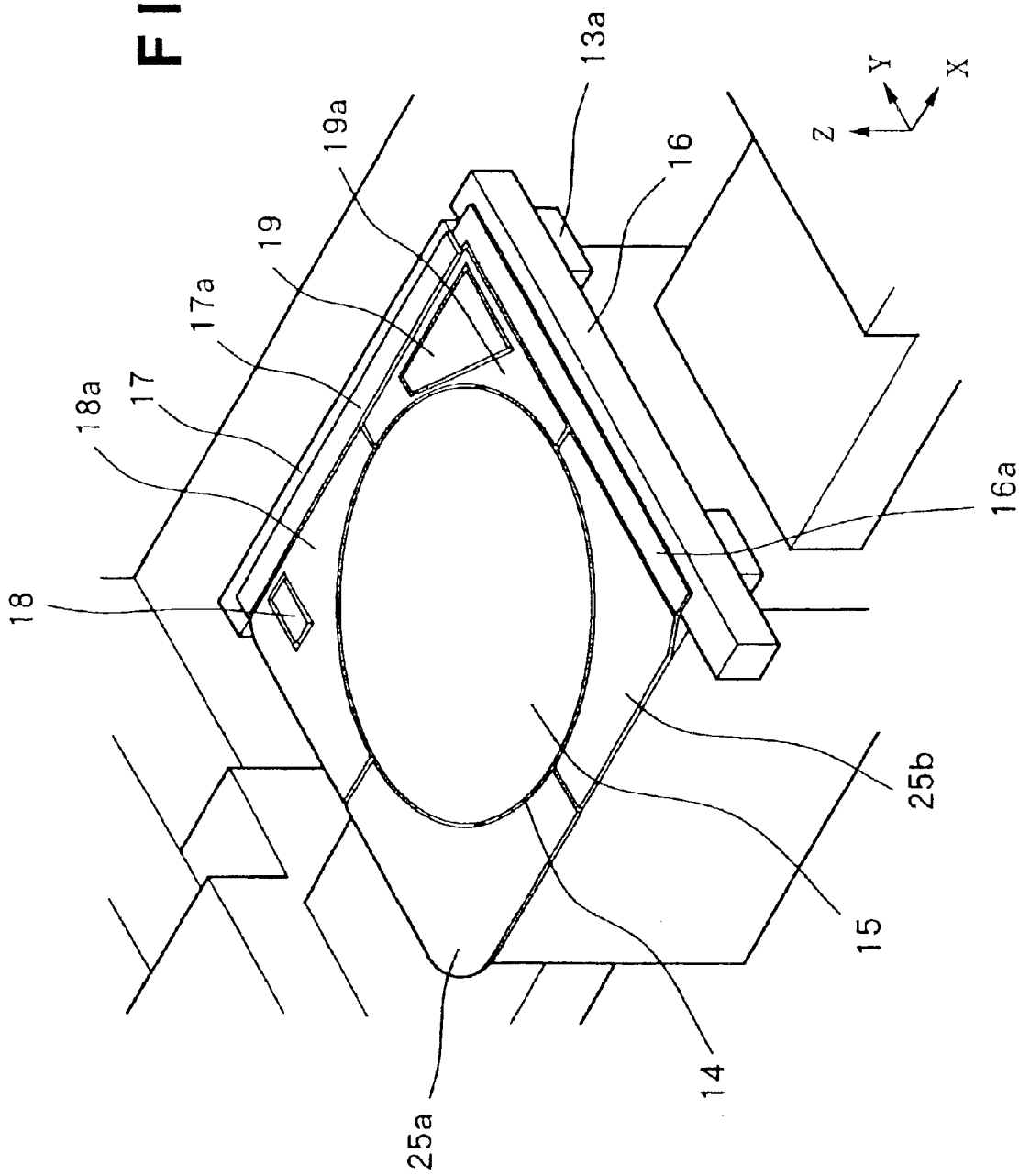
FIG. 14 is an enlarged, perspective view showing the fine moving stage and purge plate according to the fourth embodiment.
Figure 15A:
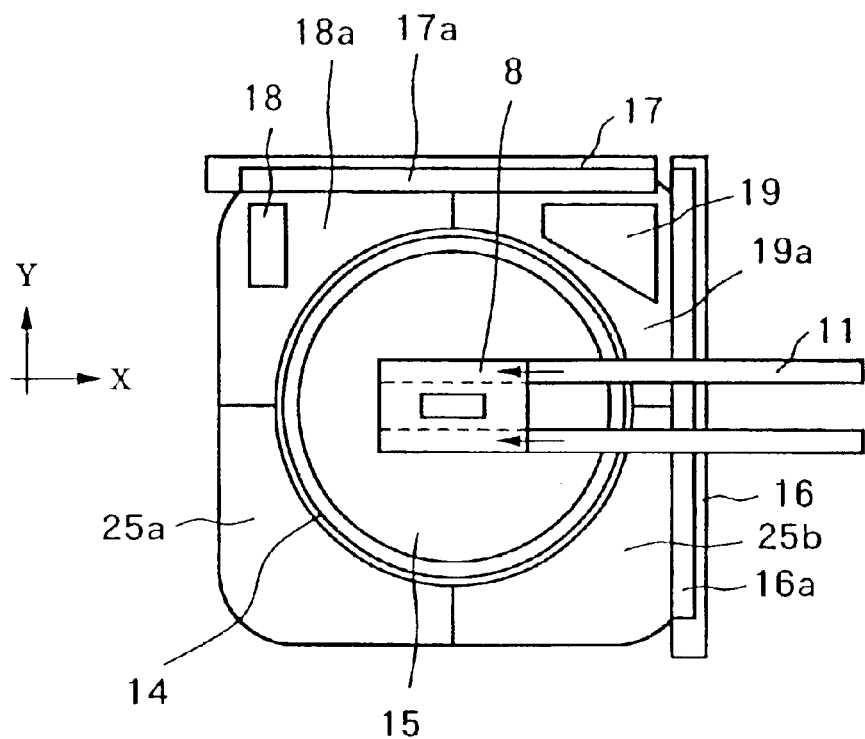
FIGS. 15A and 15B are a plan view and a side view showing the purge plate according to the fourth embodiment.
Figure 15B:
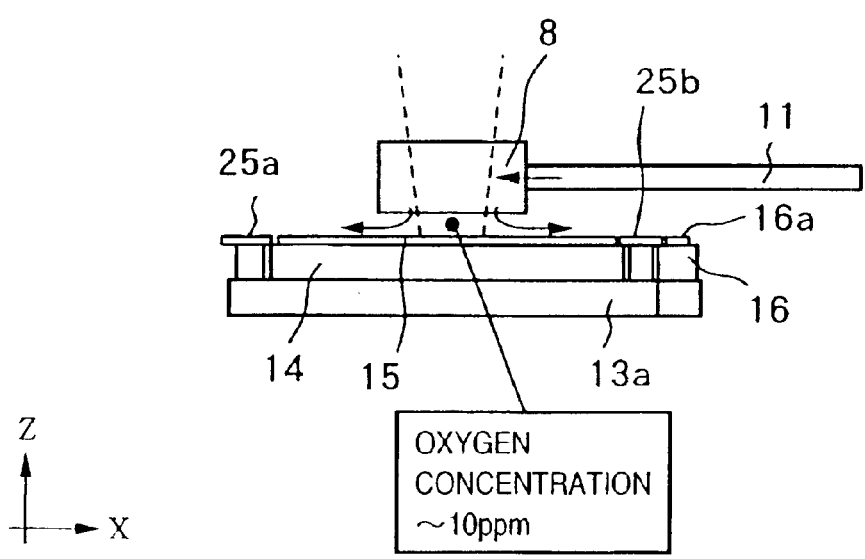
Figure 17:
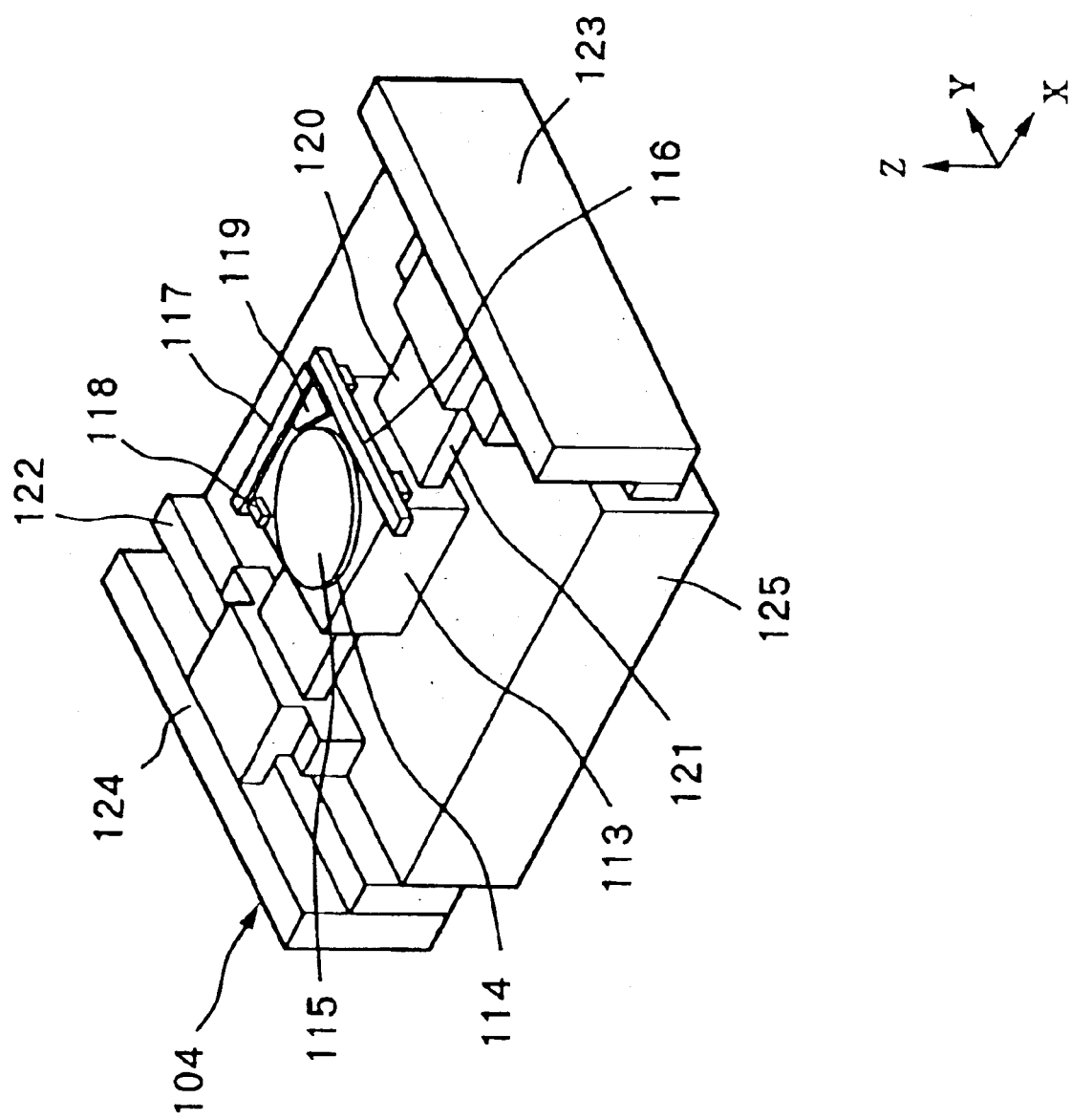
FIG. 17 is a perspective view showing the whole arrangement of a conventional stage device.
Figure 18A:
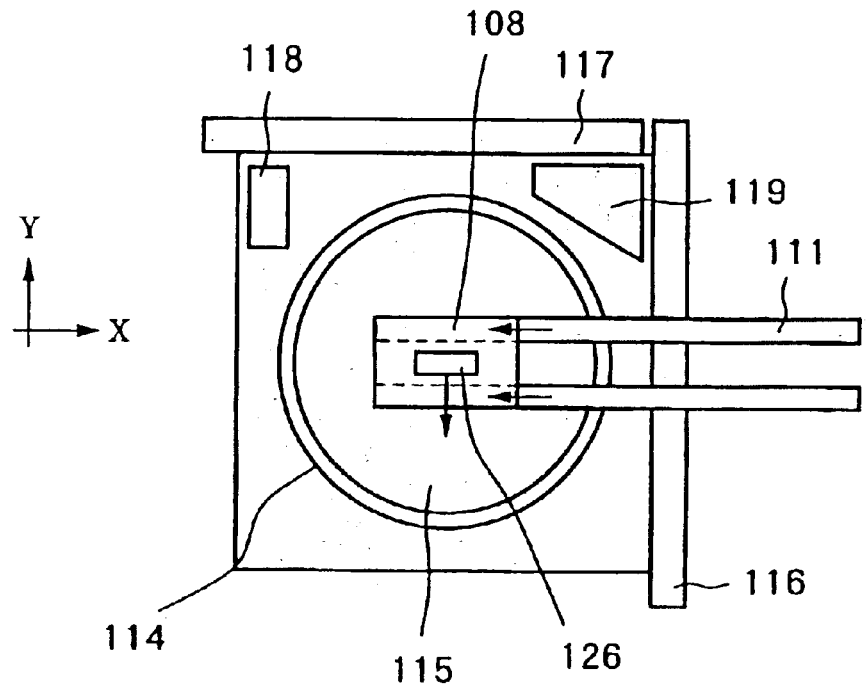
FIGS. 18A and 18B are a plan view and a side view showing a conventional purge plate.
Figure 18B:
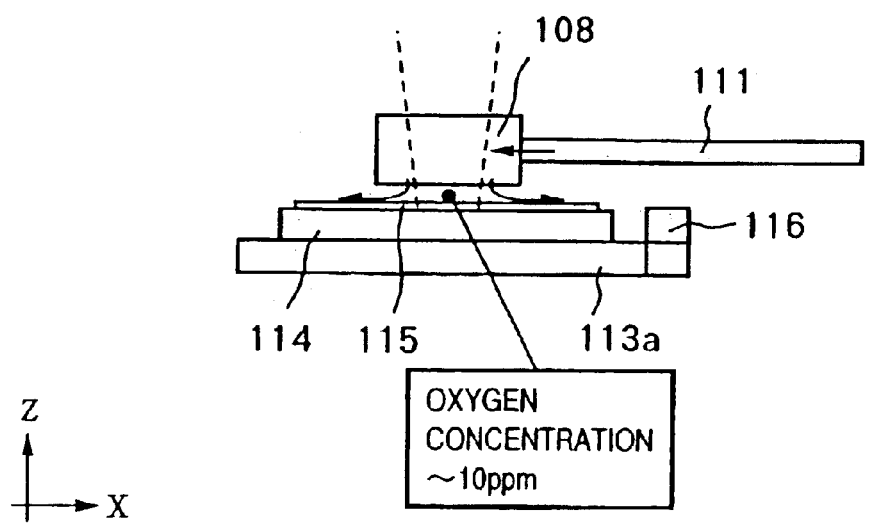
Figure 19B:
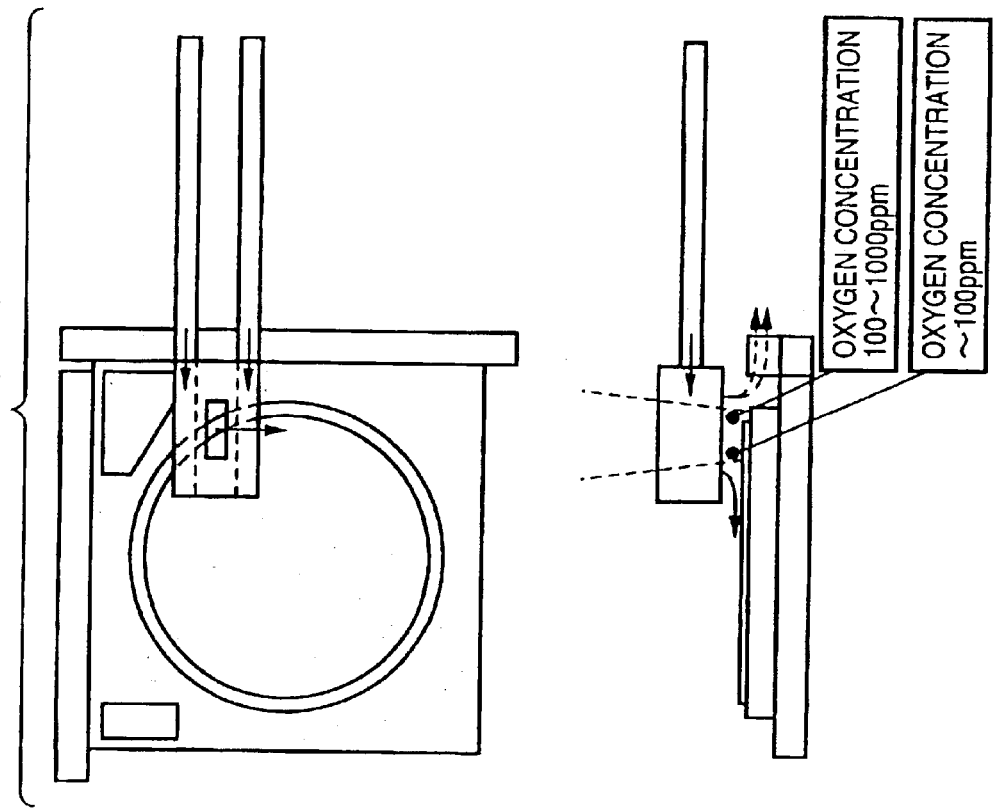
FIGS. 19A and 19B show plan views and side views of a conventional purge device.
Figure 19A:
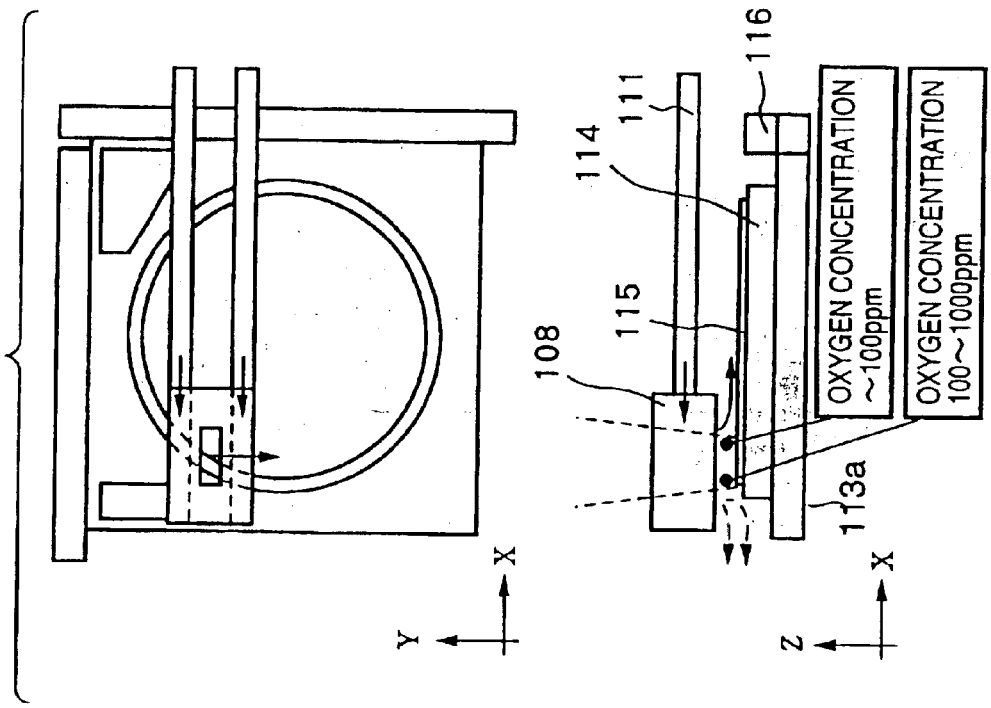
Figure 20B:
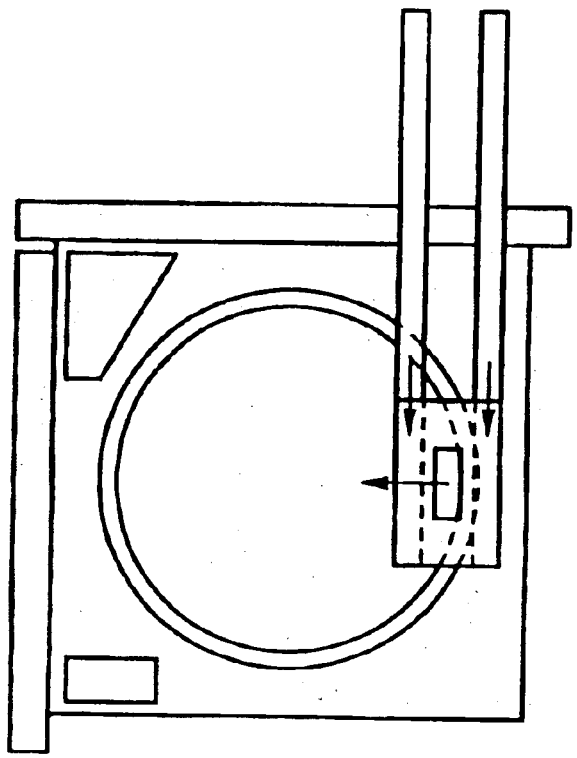
FIGS. 20A and 20B are plan views showing the conventional purge plate.
Figure 20A:
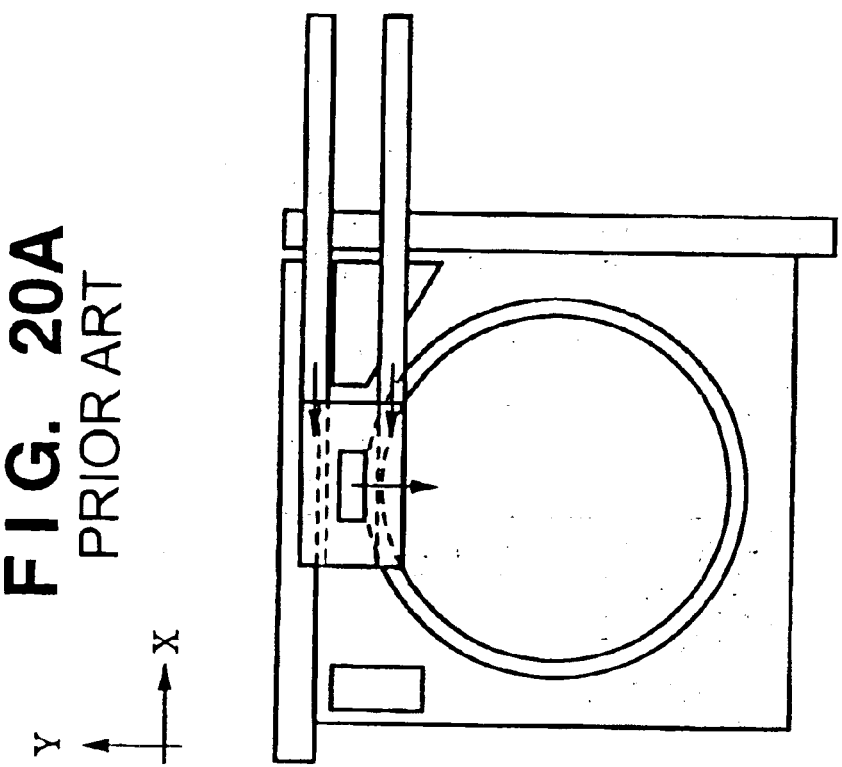

As shown in FIG. 14, an X bar mirror purge plate 16a is integrated with the upper surface of the X bar mirror 16. A Y bar mirror purge plate 17a is also integrated with the Y bar mirror 17. The purge plates can be continuously formed from other purge plates.

As described above, according the first to fourth embodiments, flat plate members almost flush with the wafer surface are arranged adjacent to the wafer periphery. This arrangement prevents an increase in oxygen concentration caused by a purge error in exposure at the wafer periphery. Nitrogen purge can be stably performed in the whole wafer space. As a result, the exposure efficiency of the exposure apparatus using vacuum ultraviolet radiation (e.g., an $F_2$ laser or the like) can be increased, glass contamination can be prevented, and an exposure apparatus with high exposure stability can be implemented.

As described above, the purge plate can be divided at a plurality of portions.

(1) A purge plate is adhered to the upper surface of a bar mirror. The overhang of the purge plate between the bar mirror and the periphery of the wafer chuck can be decreased, and the flexure and vibrations of the purge plate can be reduced.

(2) A purge plate integrated with each sensor portion can constitute a purge plate suitable for local purge at the sensor. In, for example, exchanging the sensor, the sensor and sensor purge plate can be locally detached.

(3) Since the wafer chuck and some of the purge plates are integrated, all the purge plates need not be temporarily removed in exchanging the wafer chuck. The wafer chuck can be exchanged without any interference with the wafer chuck exchange robot hand.

Purge plates with the divided structure offer the above-mentioned merits, can reduce distortion and stress between the purge plates and the top plate of the fine moving stage, and can reduce distortion of the X and Y bar mirrors mounted on the fine moving stage. Thus, purge can be stably executed without decreasing the stage position measurement precision. At the same time, the divided structure can easily attain the flatness precision in purge plate processing, and can increase the purge space precision.

The purge plate is divided, and some of the divided plates are integrated with the wafer chuck or the X and Y bar mirrors. This facilitates exchanging the wafer chuck, and can increase the bar plate rigidity and stage control precision.

A purge nozzle for locally injecting purge gas is arranged at a portion where a hole is formed in the purge plate of the illuminance sensor, reference mark, or the like. Purge can be stably performed even in exposure near the illuminance sensor and reference mark. The purge gas consumption flow rate can be reduced by injecting local purge gas immediately before exposing a wafer portion near the illuminance sensor and reference mark.

(Fifth Embodiment)

FIGS. 23 to 28 are views showing the arrangement of the wafer stage of an exposure apparatus according to the fifth embodiment of the present invention.

The overall arrangement of the exposure apparatus of the fifth embodiment is the same as that of the exposure apparatus of the first embodiment shown in FIG. 1 except for the arrangement of a wafer stage 4, and a description thereof will be omitted.

Figure 23:
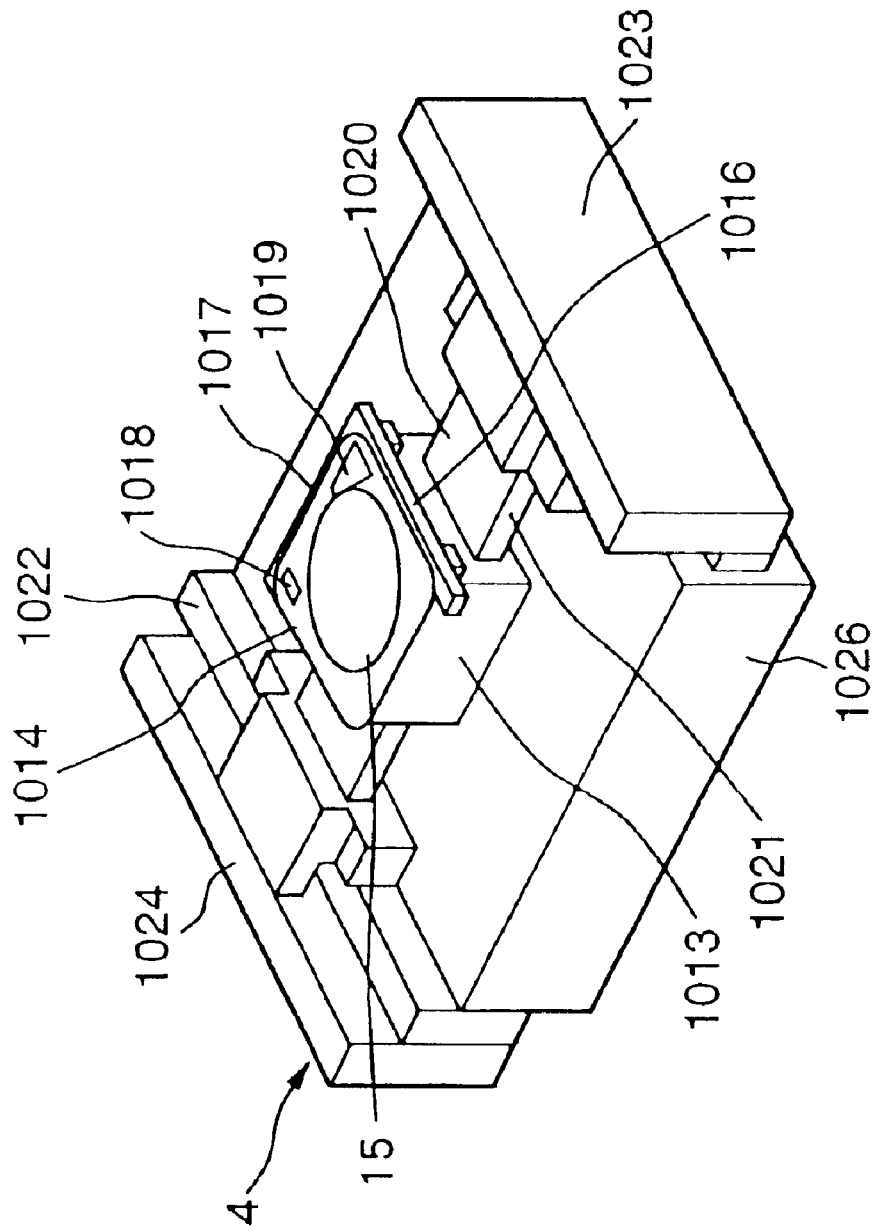
FIG. 23 is a perspective view showing the stage device of an exposure apparatus according to the fifth embodiment of the present invention.

In FIG. 23, reference numeral 15 denotes a wafer whose single-crystal silicon substrate surface is coated with a resist in order to project and to transfer a reticle pattern drawn on a reticle substrate; 1013, a fine moving stage, which finely adjusts the wafer 15 in the optical axis direction and tilt direction of the reduction exposure system and a rotational direction about the optical axis as a center; and 1014, a purge plate-integrated wafer chuck, which supports and fixes the wafer 15 onto the fine moving stage 1013. As shown in FIG. 24, the purge plate-integrated wafer chuck 1014 is constituted by integrating, with the periphery of a general disk-like wafer chuck, a purge plate, which is almost flush with the wafer 15 and formed from ceramic or the like. Reference numeral 1016 denotes an X bar mirror, which is a target mirror for measuring the X position of the fine moving stage by a laser interferometer (not shown); and 1017, a Y bar mirror, which is a target for measuring the Y position of the fine moving stage.

Reference numeral 1018 denotes an illumination sensor, which is arranged on the upper surface of the fine moving stage 1013, calibrates and measures the illuminance of exposure light before exposure, and uses the illuminance for correction of the exposure amount.

Reference numeral 1019 denotes a stage reference mark, which is arranged on the upper surface of the fine moving stage 1013 and has a stage alignment measurement target. Alignment of the master and wafer stage, and the like, are performed by an alignment measurement device (not shown).

Reference numeral 1020 denotes an X linear motor, which moves and drives the fine moving stage 1013 in the X direction; 1021, an X guide, which moves and guides the fine moving stage 1013 in the X direction; 1022, a Y guide, which moves and guides the X guide 1021 and fine moving stage 1013 in the Y direction; 1023 and 1024, Y linear motors, which move and drive the fine moving stage 1013 in the Y direction; and 1026, a stage surface plate, which plane-guides the fine moving stage 1013.

An illuminance sensor purge plate 1018a integrated with the purge plate-integrated wafer chuck 1014 is arranged around the illuminance sensor 1018, is almost flush with the surface of the wafer 15, and forms a purge space around the wafer chuck 1014.

Similarly, a stage reference mark purge plate 1019a integrated with the purge plate-integrated wafer chuck 1014 is arranged around the stage reference mark 1019, is almost flush with the surface of the wafer 15, and forms a purge space around the wafer chuck 1014.

Figure 25A:
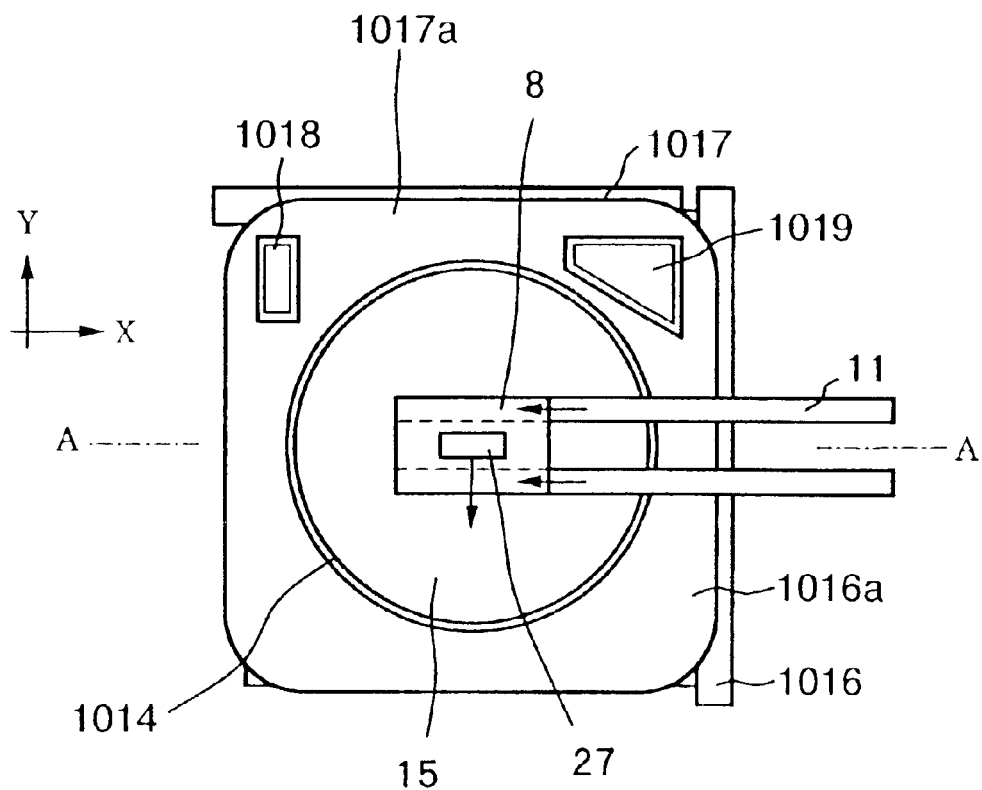
FIGS. 25A and 25B are a plan view and a side view showing the purge plate.
Figure 25B:
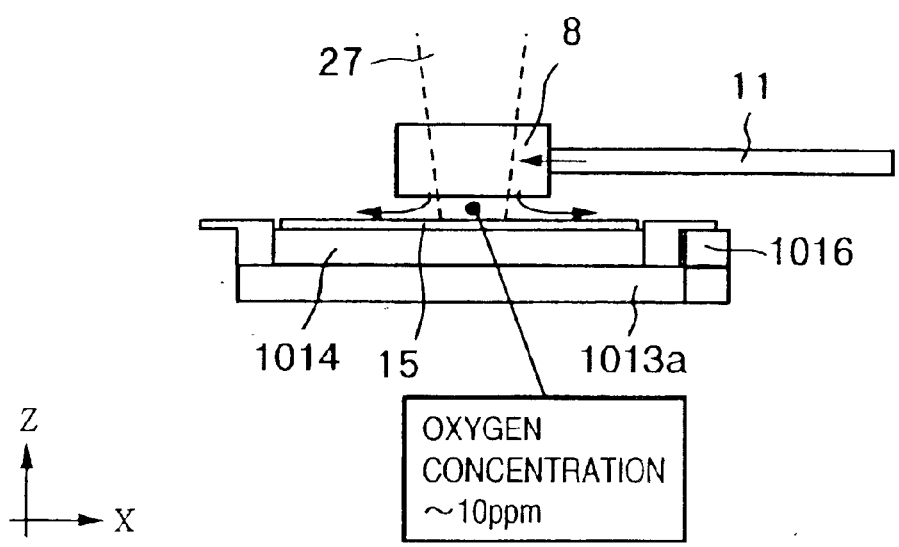
Figure 27A:
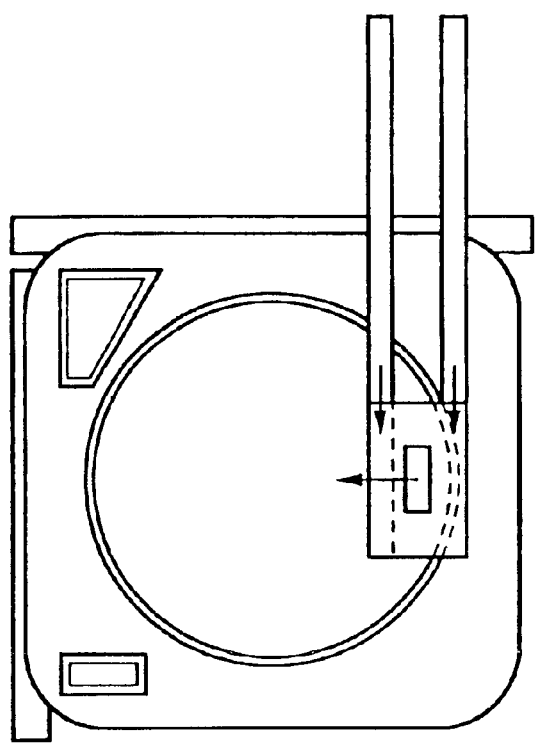
FIGS. 27A and 27B are plan views showing the purge device.
Figure 27B:
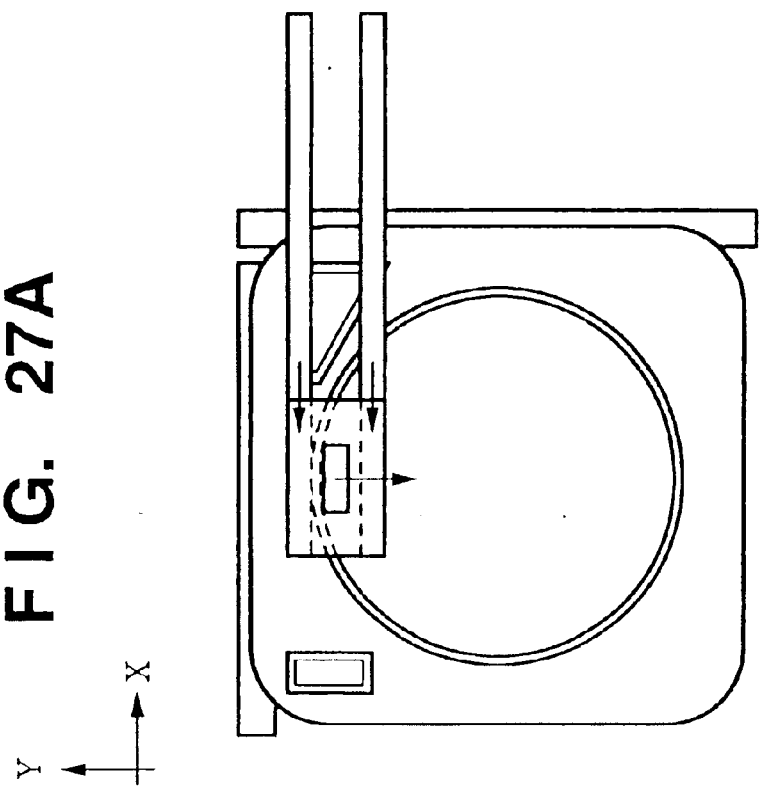

As shown in FIGS. 25A and 25B, slit exposure light 1027 of a scan exposure type is emitted to the center of the optical path of the exposure light. A wafer purge nozzle 8 is set above the exposed portion, and the space above the wafer 15 is purged with purge gas (nitrogen or the like) injected from the wafer purge nozzle 8. An oxygen concentration of 10 ppm or less is achieved around the center of the wafer 15.

In the purge plate-integrated wafer chuck 1014, the purge plates are arranged around the wafer 15. Even in exposure at the periphery of the wafer 15, a decrease in the pressure of the purge space by purge gas leaking from the periphery of the purge plate-integrated wafer chuck 1014 can be prevented, as shown in FIGS. 26A, 26B, 27A, and 27B. Gas other than purge gas does not externally enter, and purge with nitrogen serving as purge gas from the wafer purge nozzle 8 can be stably performed.

The oxygen concentration can, therefore, be maintained at 10 ppm or less in the entire region irradiated with the slit exposure light 1027.

Figure 28:
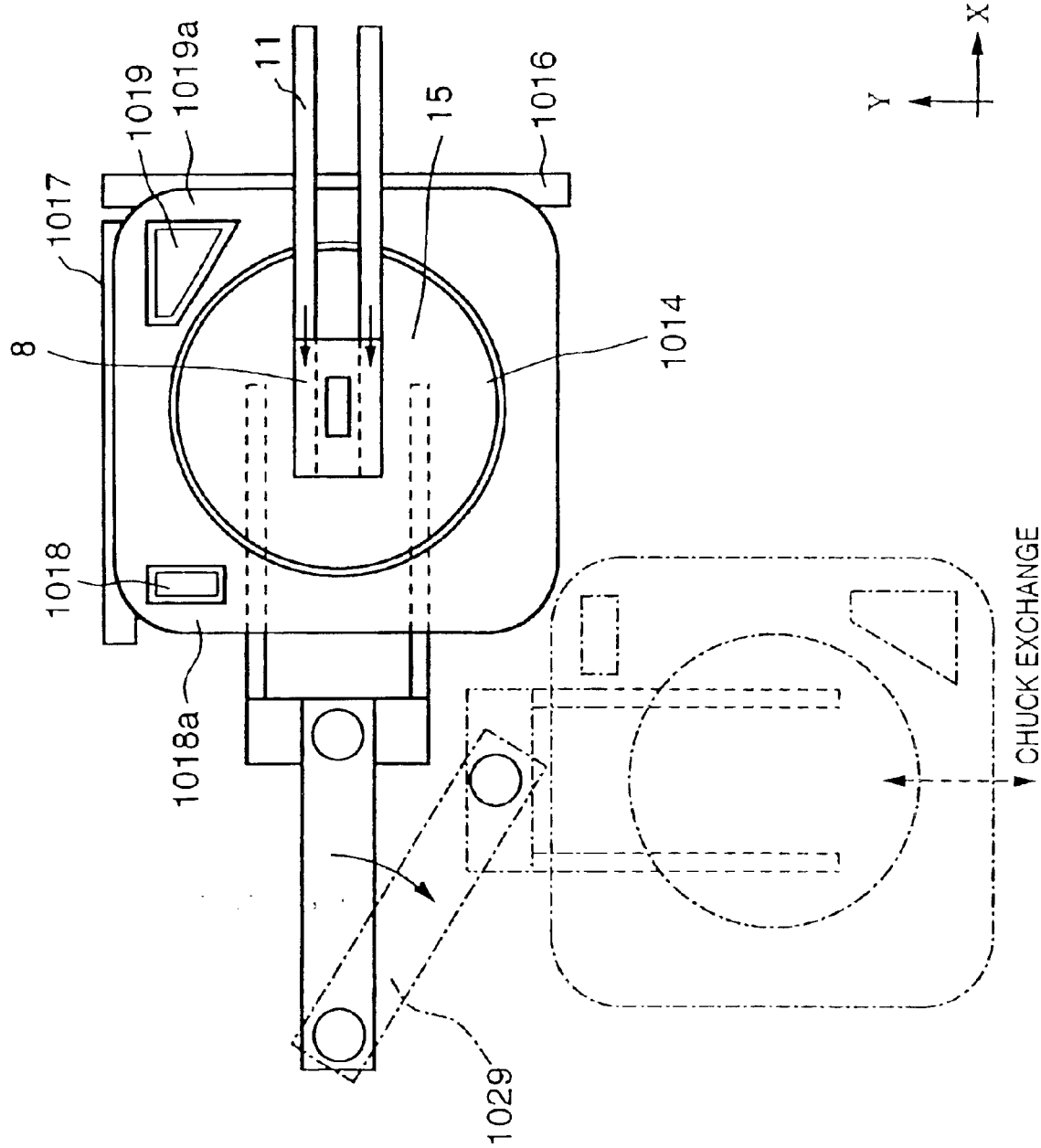
FIG. 28 is a view for explaining a chuck exchange method.

With the use of the purge plate-integrated wafer chuck 1014, as shown in FIG. 28, the wafer chuck can be detached together with the purge plate in exchanging or cleaning the wafer chuck.

The purge plate-integrated wafer chuck 1014 is detached by a chuck exchange unit 1029 shown in FIG. 28. As shown in FIG. 28, the purge plate-integrated wafer chuck 1014 is detached and exchanged by a robot having two forks. That is, the purge plate around the wafer chuck is retracted above and detached together with the wafer chuck. This structure allows automatically exchanging the wafer chuck without removing the purge plate around the wafer chuck. Note that an X bar mirror purge plate 1016a, a Y bar mirror purge plate 1017a, an illuminance sensor purge plate 1018a, and a stage reference mark purge plate 1019a may be arranged integrally or separately.

(Sixth Embodiment)

Figure 29A:
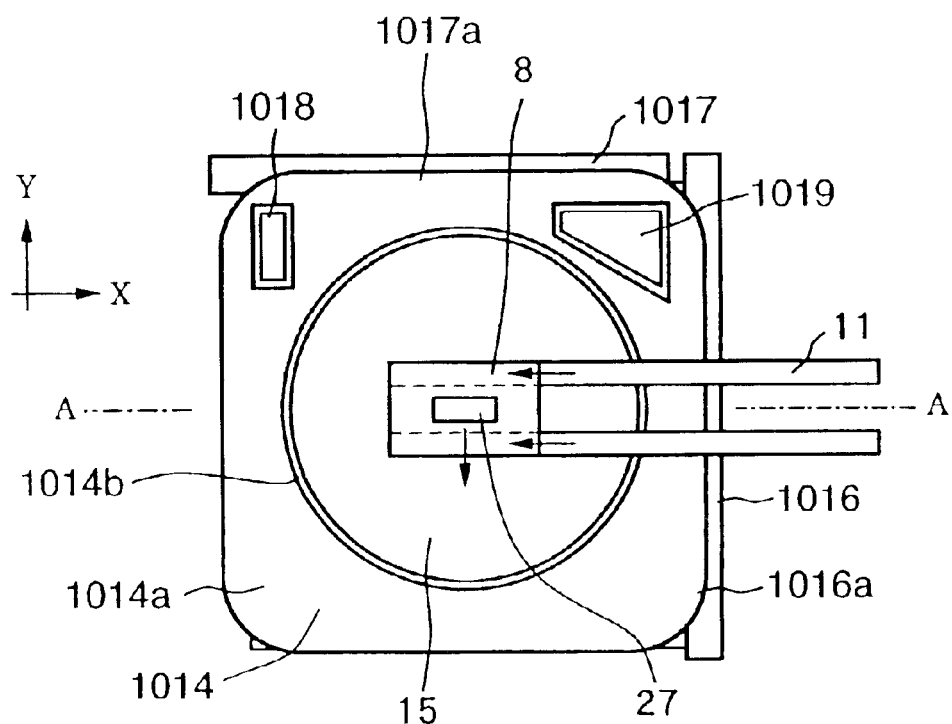
FIGS. 29A and 29B are a plan view and a side view showing the sixth embodiment of the present invention.
Figure 29B:
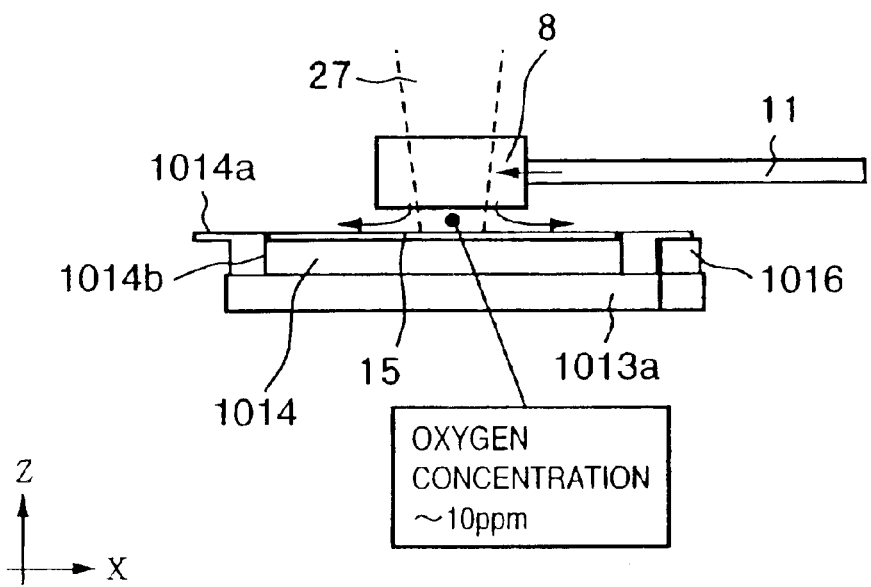

The fifth embodiment has described the method of integrating the wafer chuck and purge plate by the same component. FIGS. 29A and 29B show the sixth embodiment.

In the sixth embodiment, a purge plate 1014a is arranged as another component in tight contact with the circumferential surface of a conventional wafer chuck. The entire surface in contact with the wafer chuck is coupled as a coupling portion 1014b by an adhesive or the like. The wafer chuck and purge plate can be integrated without any gap, similar to the first embodiment.

As described above, according to the fifth and sixth embodiments, flat plate members almost flush with the wafer surface are arranged adjacent to the wafer periphery. This arrangement prevents an increase in oxygen concentration caused by a purge error in exposure at the wafer periphery. Nitrogen purge can be stably performed in the whole wafer space. The exposure efficiency of the exposure apparatus using vacuum ultraviolet radiation ($F_2$ laser or the like) can be increased, glass contamination can be prevented, and an exposure apparatus with high exposure stability can be implemented.

Since the purge plate is integrated with the wafer chuck, the gap between the wafer periphery and the purge plate can be eliminated, realizing purge with high-precision purge gas.

The purge plate is integrated with the wafer chuck, and thus, the wafer chuck can be easily exchanged.

The wafer chuck and purge plate are integrated, and the bar plate rigidity and stage control precision can be increased.

As described above, the first to sixth embodiments can prevent a decrease in purge pressure in exposure around the wafer and an increase in oxygen concentration caused by a purge error.

(Seventh Embodiment)

A semiconductor device manufacturing process using the exposure apparatus according to the first to sixth embodiments will be explained.

Figure 21:
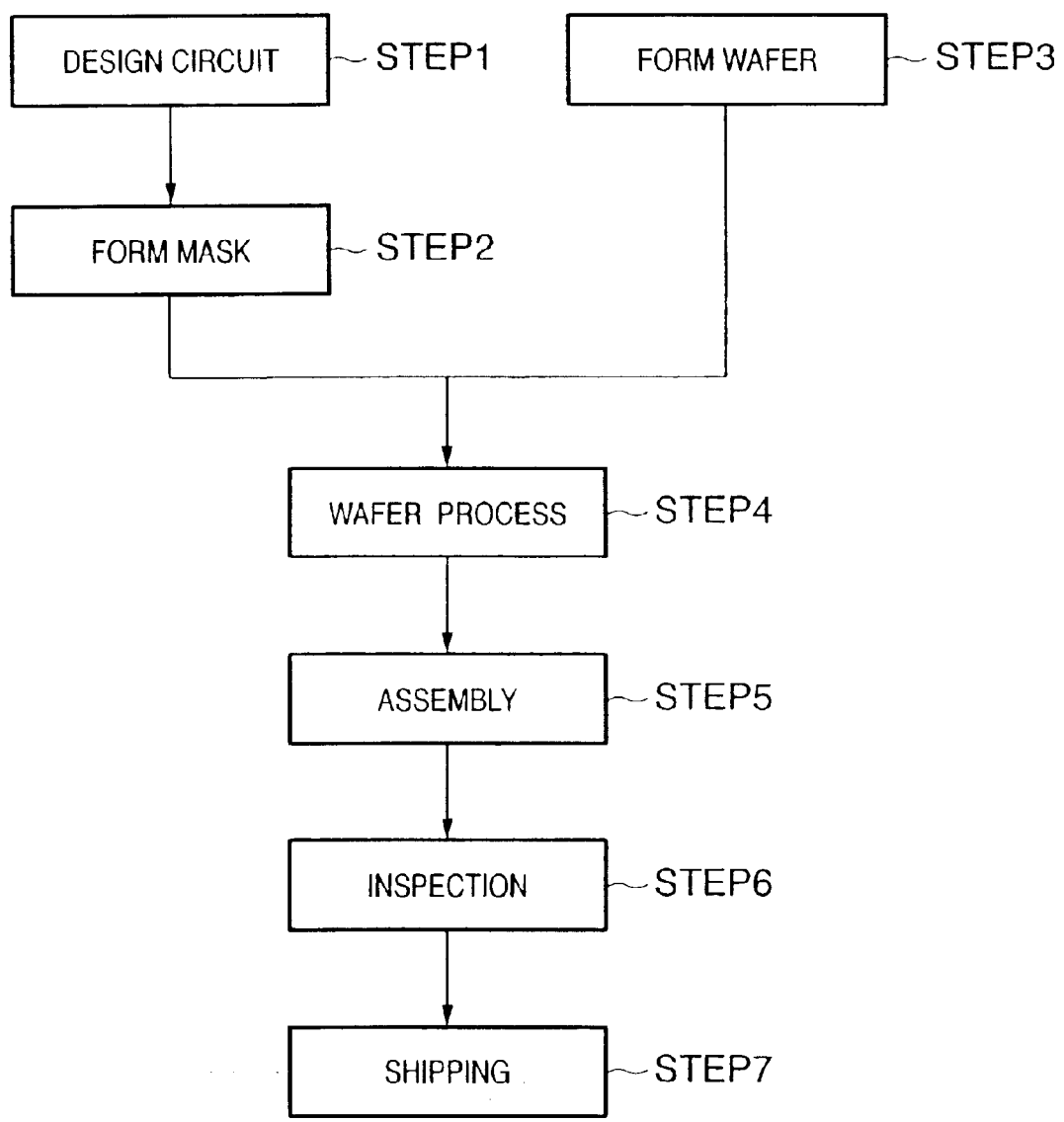
FIG. 21 is a flow chart showing the overall manufacturing process of a semiconductor device.

FIG. 21 shows the flow of the whole manufacturing process of the semiconductor device. In step 1 (circuit design), a semiconductor device circuit is designed. In step 2 (mask formation), a mask is formed based on the designed circuit pattern. In step 3 (wafer formation), a wafer is formed using a material such as silicon. In step 4 (wafer process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 22:
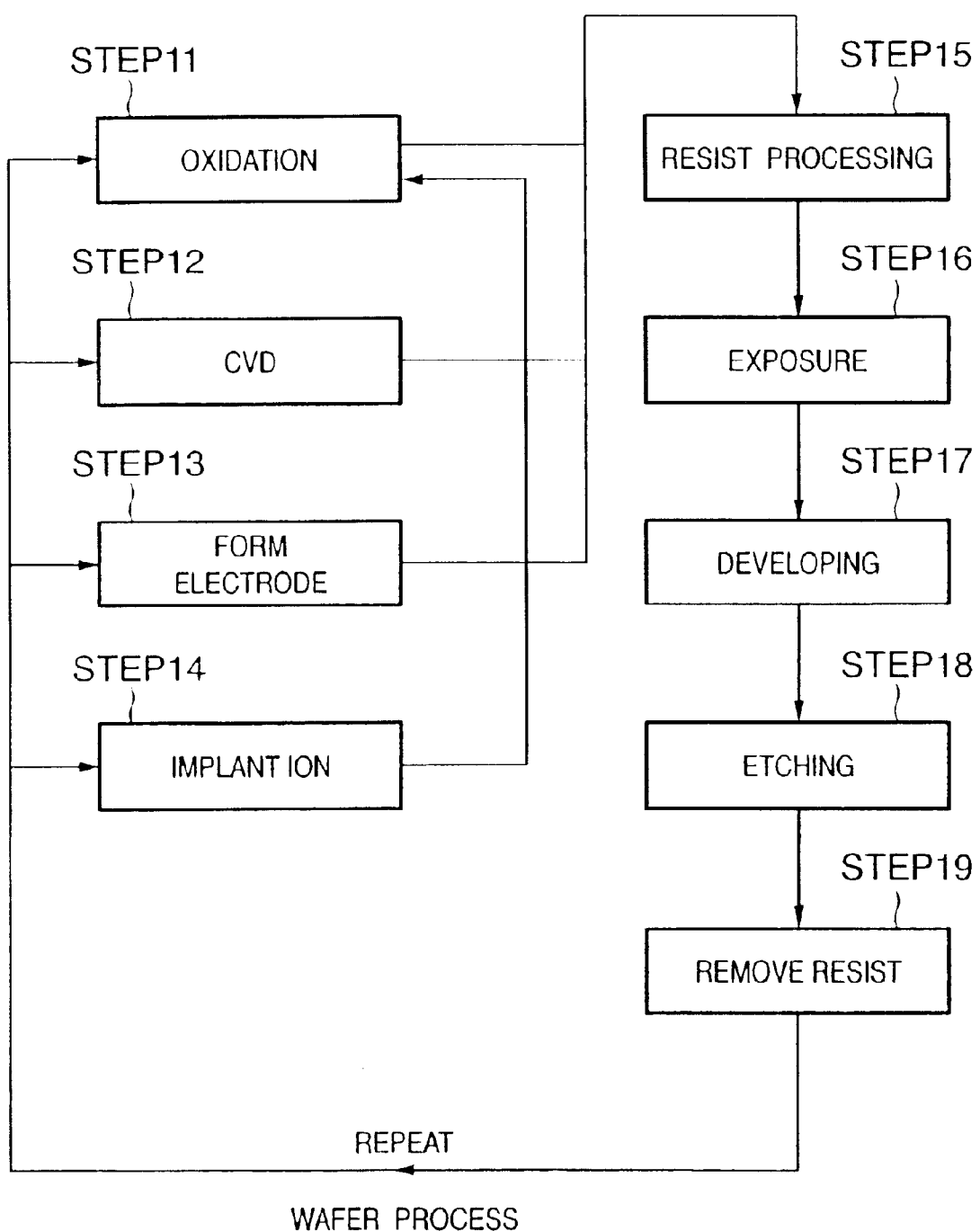
FIG. 22 is a flow chart showing a detailed wafer process in FIG. 21.

FIG. 22 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the exposure apparatus transfers a circuit pattern onto the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The present invention is not limited to the above embodiments and various changes and modifications can be made within the spirit and scope of the present invention. Therefore, to apprise the public of the scope of the present invention, the following claims are made.

What is claimed is:

1. An exposure apparatus comprising:

a movable stage;

a chuck device which is arranged on said stage and holds a substrate;

a first gas supply device for supplying a gas to a position of the substrate to be exposed; and a plurality of divided planar members which are arranged adjacent to a periphery of the substrate such that at least a part of said divided planar members covers a position measurement mirror of said movable stage, and are flush with or almost flush with a surface of the substrate or a substrate holding surface of said chuck device.

2. The apparatus according to claim 1, further comprising a second gas supply device for supplying a gas near a sensor, which is arranged on said movable stage wherein said second gas supply device supplies gas near the sensor in synchronism with a timing at which one of a measuring operation of the sensor is performed and a region of the substrate near the sensor is exposed.

3. The apparatus according to claim 1, wherein at least one of said plurality of divided planar members is so arranged as to be substantially flush with a reference mark and as to surround a periphery of the reference mark formed on said stage.

4. The apparatus according to claim 3, further comprising a second gas supply device for supplying a gas near the reference mark.

5. The apparatus according to claim 4, wherein said second gas supply device supplies gas near a periphery and an upper surface of the reference mark in synchronism with a timing at which one of the reference mark is detected and a region of the substrate near the reference mark is exposed.

6. The apparatus according to claim 1, wherein at least one of said plurality of divided planar members is integrated with said chucked device.

7. The apparatus according to claim 6, wherein said planar member integrated with said chuck device is so constituted as to be moved to above said stage together with said chuck device by an arm inserted externally from said stage to below said chuck device.

8. The apparatuses according to claim 1, wherein at least one of said plurality of divided planar members is integrated with a member serving as a position measurement target for said stage.

9. A device manufacturing method comprising the steps of:

transferring a pattern to a photosensitive material applied to a substrate by the exposure apparatus as defined in claim 1; and developing the substrate bearing the pattern.

10. An exposure apparatus comprising:

a movable stage;

a chuck device, which is arranged on said stage and holds a substrate;

a gas supply device for supplying a gas to a position of the substrate to be exposed; and a planar member which is arranged adjacent to a periphery of the substrate such that at least a part of said planar member covers a position measurement mirror of said movable stage, is flush with or almost flush with a surface of the substrate or a substrate holding surface of said chuck device, and is integrated with said chuck device.

11. The apparatus according to claim 10, wherein said planar member is constituted by the same component as said chuck device and integrated with said chuck device.

12. The apparatus according to claim 10, wherein said planar member is constituted by a component different from said chuck device, is coupled to said chuck device, and is integrated with said chuck device.

13. A device manufacturing method comprising the steps of:

transferring a pattern to a photosensitive material applied to a substrate by the exposure apparatus defined in claim 10; and developing the substrate bearing the pattern.

14. The apparatus according to claim 10, wherein said planar member integrated with said chuck device is so constituted as to be moved to above said stage together with said chuck device by an arm inserted externally from said stage to below said chuck device.

* * * * *